United States Patent
Iwayama

(10) Patent No.: US 8,902,634 B2
(45) Date of Patent: Dec. 2, 2014

(54) RESISTANCE CHANGE TYPE MEMORY AND MANUFACTURING METHOD THEREOF

(71) Applicant: Kabushiki Kaisha Toshiba, Minato-ku, Tokyo (JP)

(72) Inventor: Masayoshi Iwayama, Nagoya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/842,299

(22) Filed: Mar. 15, 2013

(65) Prior Publication Data
US 2014/0070162 A1    Mar. 13, 2014

(30) Foreign Application Priority Data
Sep. 12, 2012    (JP) ................. 2012-200835

(51) Int. Cl.
| | |
|---|---|
| *G11C 11/00* | (2006.01) |
| *H01L 45/00* | (2006.01) |
| *H01L 43/08* | (2006.01) |
| *H01L 27/24* | (2006.01) |
| *H01L 43/12* | (2006.01) |
| *H01L 27/22* | (2006.01) |

(52) U.S. Cl.
CPC .............. *H01L 45/12* (2013.01); *H01L 45/16* (2013.01); *H01L 43/08* (2013.01); *H01L 27/2436* (2013.01); *H01L 45/1233* (2013.01); *H01L 43/12* (2013.01); *H01L 27/2463* (2013.01); *H01L 45/06* (2013.01); *H01L 45/085* (2013.01); *H01L 45/1675* (2013.01); *H01L 27/228* (2013.01)
USPC ................ 365/148; 257/421; 257/E29.323

(58) Field of Classification Search
CPC ....... G11C 13/00; G11C 213/00; H01L 45/00
USPC .......................................................... 365/148
See application file for complete search history.

(56) References Cited

U.S. PATENT DOCUMENTS

| | | | |
|---|---|---|---|
| 7,019,370 B2 | 3/2006 | Cha | |
| 7,488,648 B2 * | 2/2009 | Baik | 438/266 |
| 7,796,422 B2 * | 9/2010 | Kajiyama | 365/158 |
| 8,013,374 B2 | 9/2011 | Goo et al. | |
| 8,013,375 B2 | 9/2011 | Goo et al. | |
| 8,111,540 B2 | 2/2012 | Asao et al. | |
| 8,174,874 B2 | 5/2012 | Inaba | |
| 8,357,982 B2 * | 1/2013 | Kajiyama | 257/421 |
| 2005/0285183 A1 * | 12/2005 | Baik | 257/316 |

(Continued)

FOREIGN PATENT DOCUMENTS

| | | |
|---|---|---|
| JP | 2005-191523 A | 7/2005 |
| JP | 2006-108691 A | 4/2006 |

(Continued)

*Primary Examiner* — Telly Green
(74) *Attorney, Agent, or Firm* — Holtz, Holtz, Goodman & Chick PC

(57) ABSTRACT

According to one embodiment, a memory includes a resistance change element on an interlayer insulating film and including a lower electrode and an upper electrode, a sidewall insulating film on a side surface of the element, a plug in the interlayer insulating film and connected to the lower electrode, an interconnect on the interlayer insulating film and connected to the upper electrode. The element is provided immediately above the plug, the interconnect covers the side surface of the element via the sidewall insulating film, an upper surface of the first plug is covered with the lower electrode and the sidewall insulating film.

13 Claims, 18 Drawing Sheets

(56) References Cited

U.S. PATENT DOCUMENTS

| | | | |
|---|---|---|---|
| 2006/0220084 A1* | 10/2006 | Umehara et al. | 257/296 |
| 2007/0181964 A1* | 8/2007 | Shoji | 257/421 |
| 2009/0154224 A1* | 6/2009 | Kajiyama | 365/158 |
| 2009/0250735 A1 | 10/2009 | Asao | |
| 2011/0233697 A1* | 9/2011 | Kajiyama | 257/421 |
| 2012/0068283 A1 | 3/2012 | Hosotani et al. | |
| 2012/0217594 A1* | 8/2012 | Kajiyama | 257/421 |
| 2012/0281319 A1* | 11/2012 | Singleton et al. | 360/319 |
| 2013/0069182 A1* | 3/2013 | Ohsawa et al. | 257/421 |

FOREIGN PATENT DOCUMENTS

| | | |
|---|---|---|
| JP | 2007-149778 A | 6/2007 |
| JP | 2009-253036 A | 10/2009 |
| JP | 2010-103302 A | 5/2010 |
| JP | 2011-066361 A | 3/2011 |
| JP | 2012-069671 A | 4/2012 |

* cited by examiner

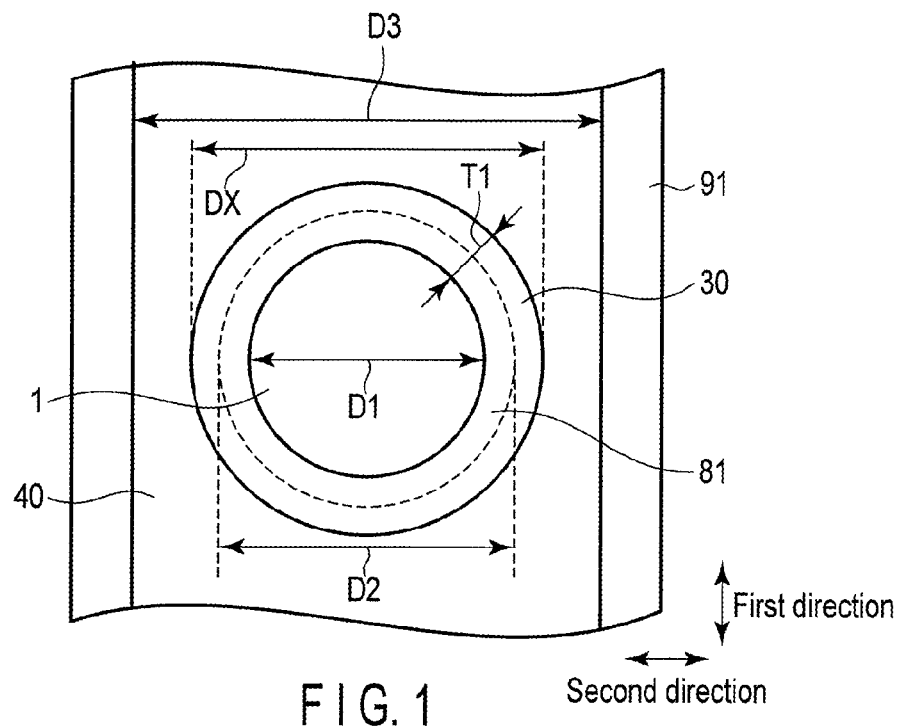
F I G. 1
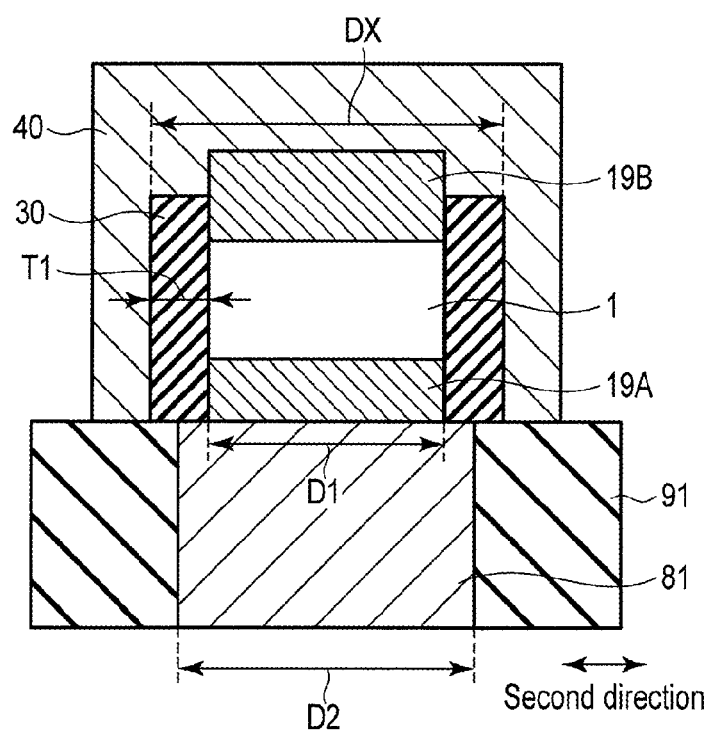
F I G. 2

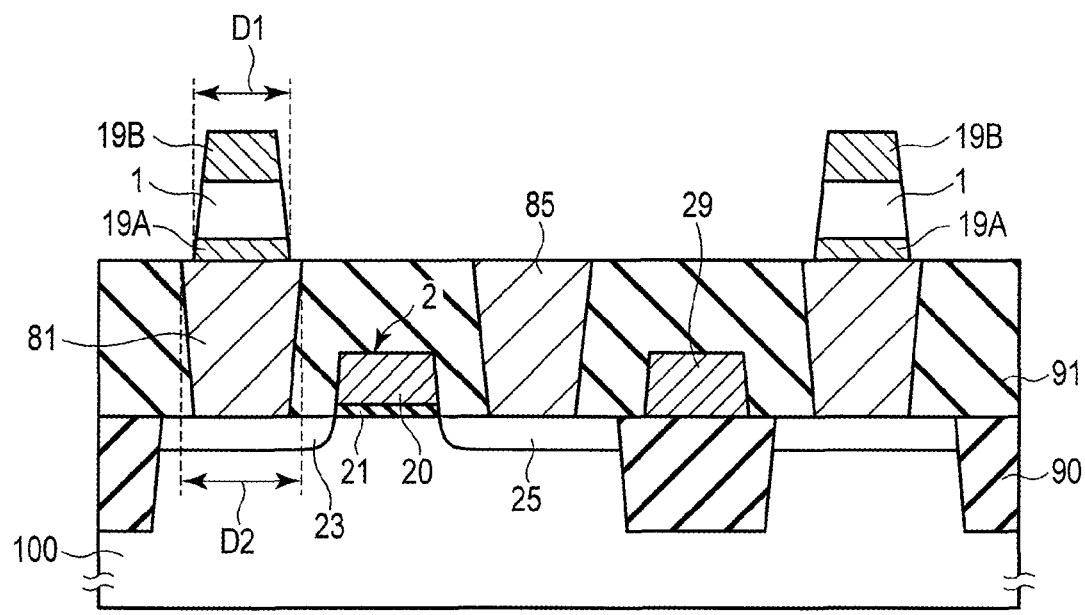
F I G. 11
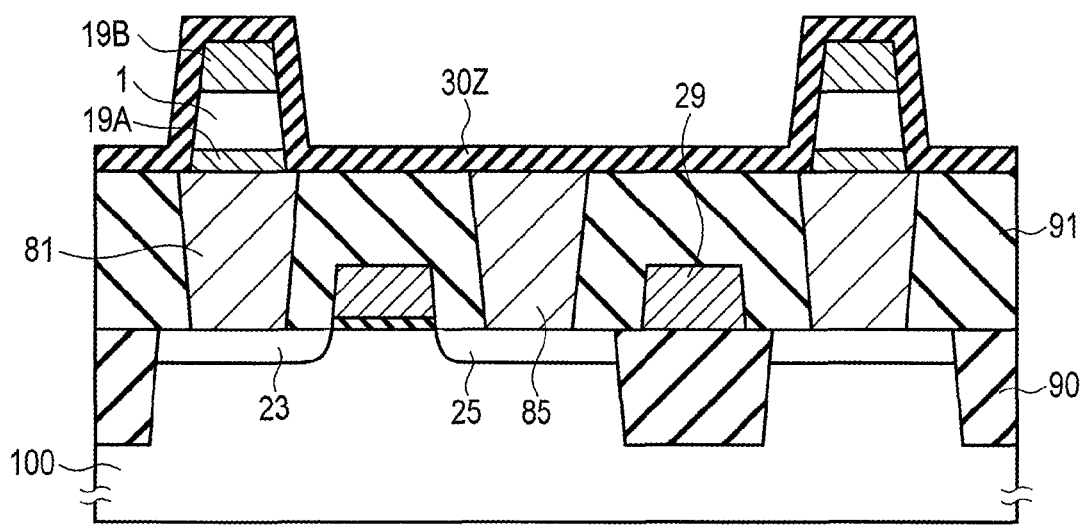
F I G. 12

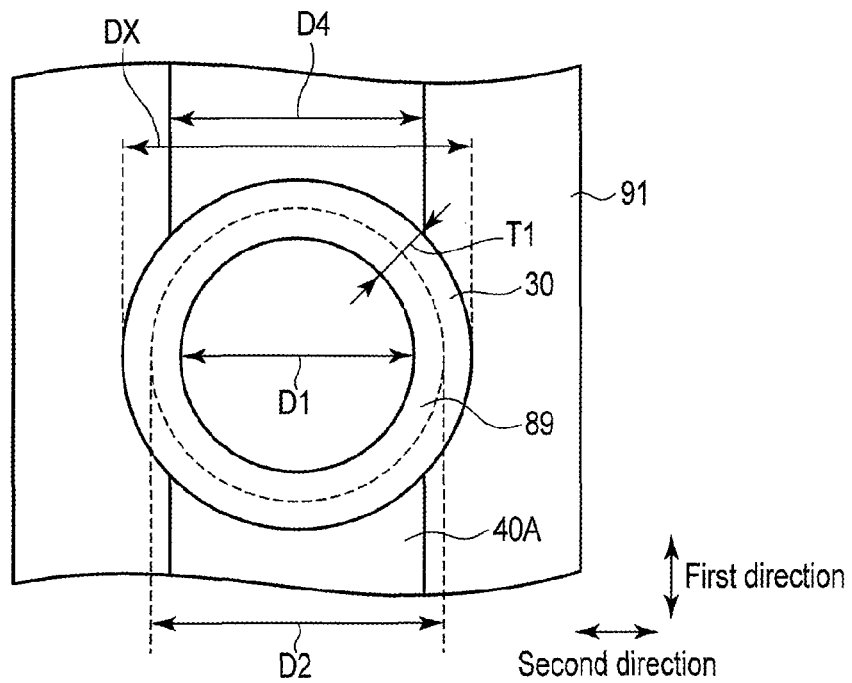
F I G. 17
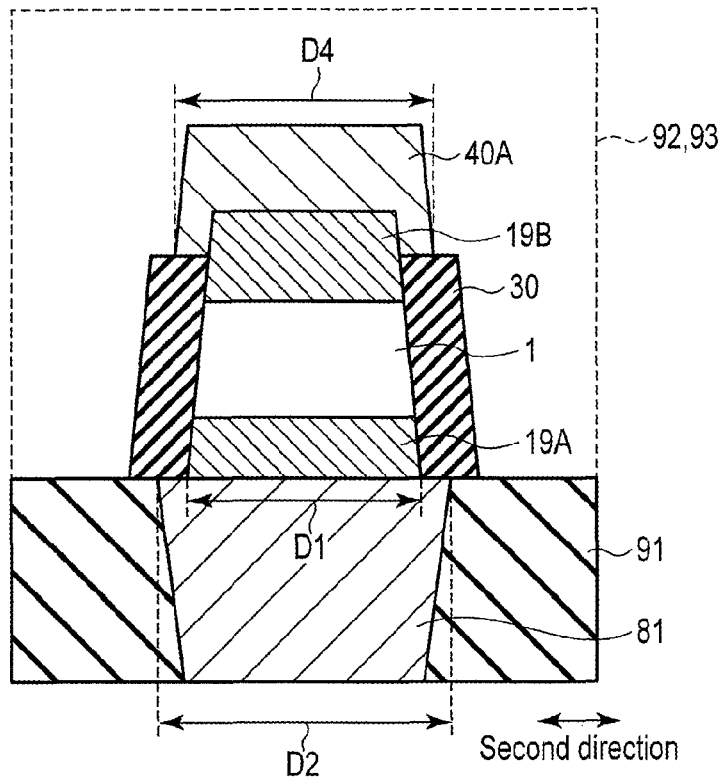
F I G. 18

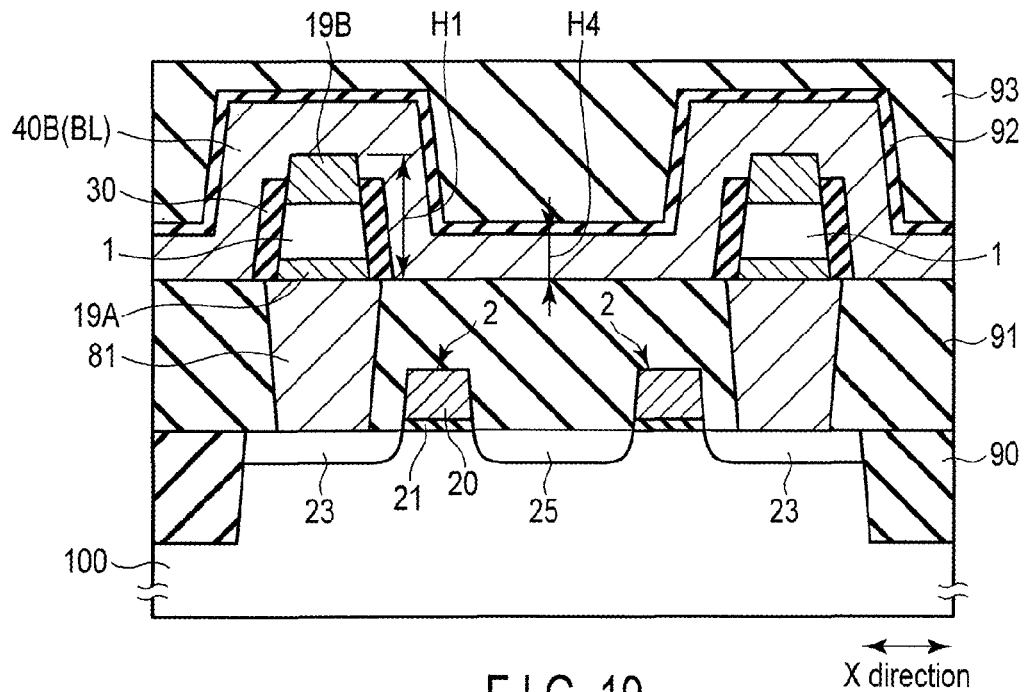
F I G. 19
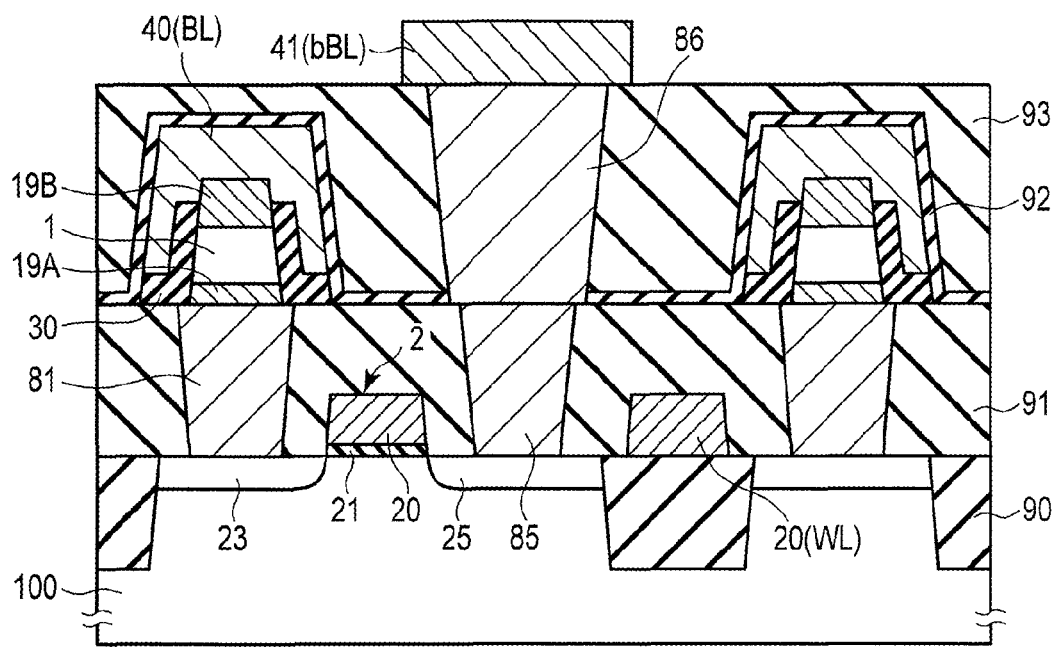
F I G. 20

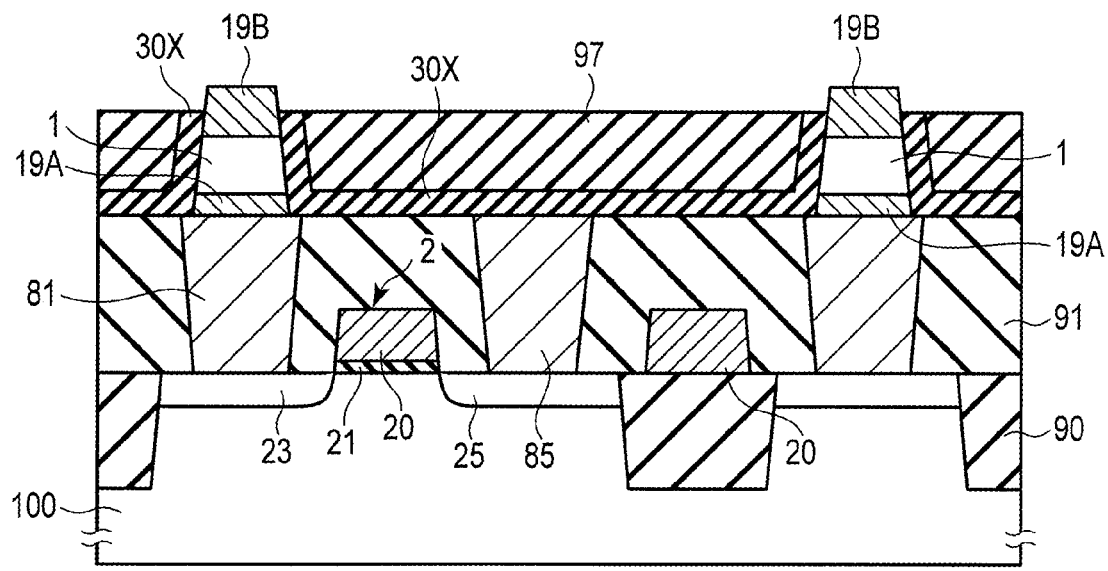
F I G. 21
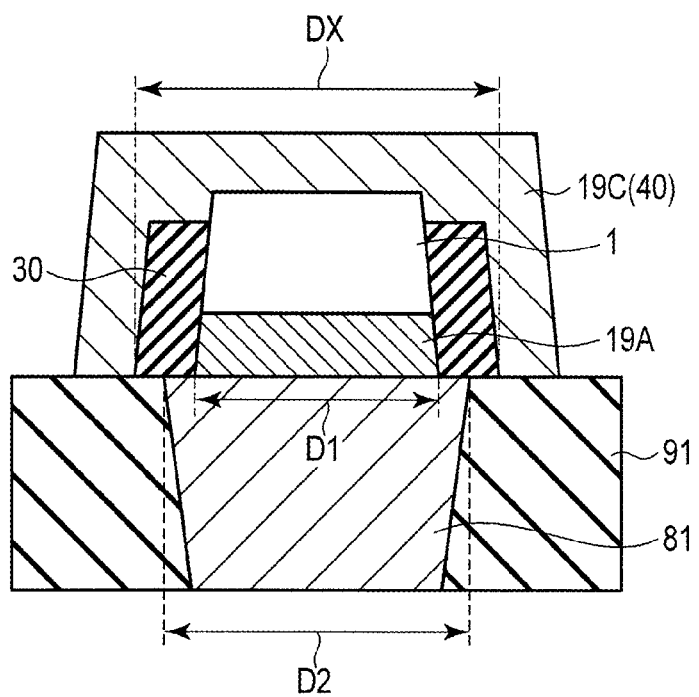
F I G. 22

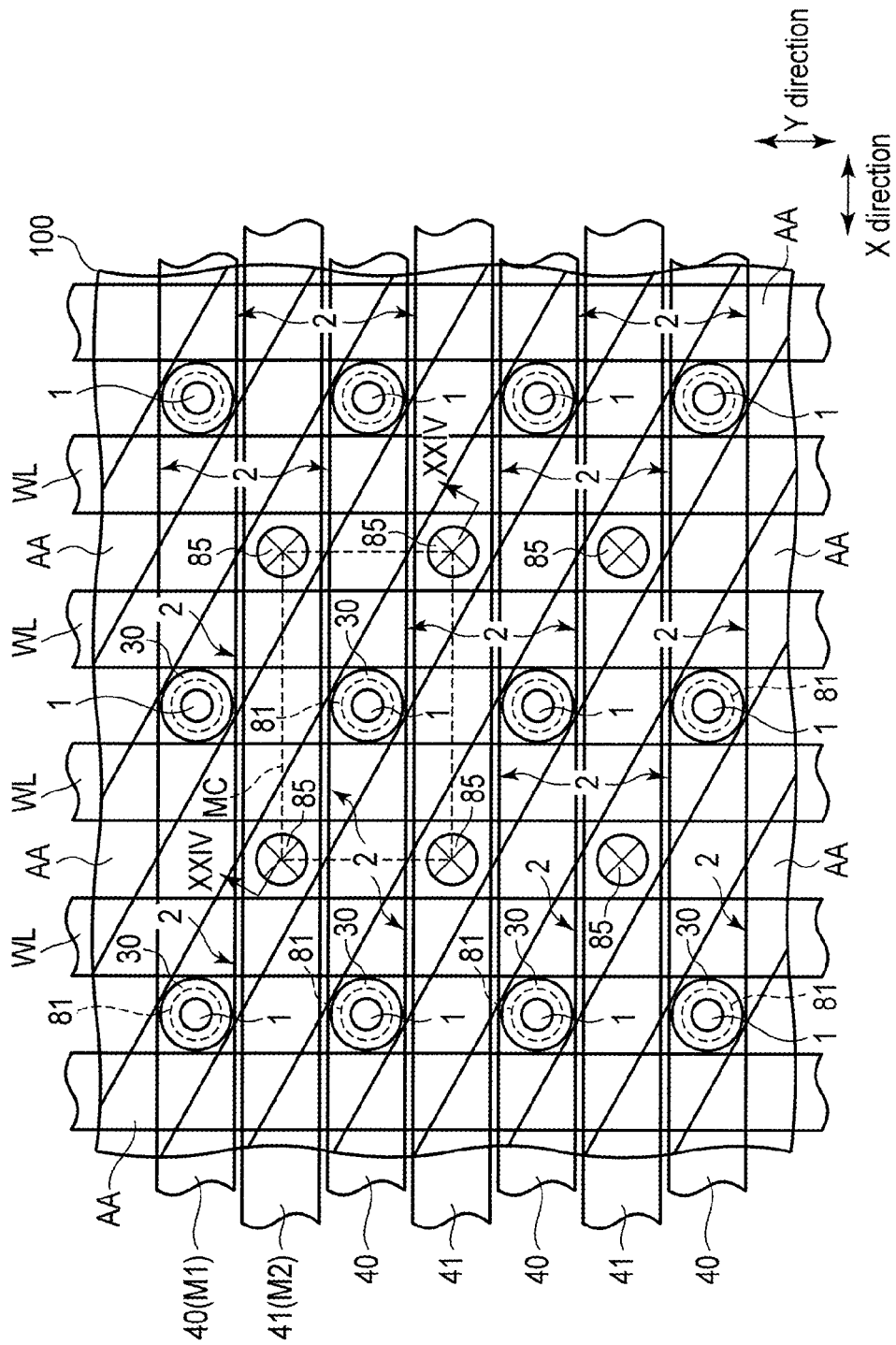
F I G. 23

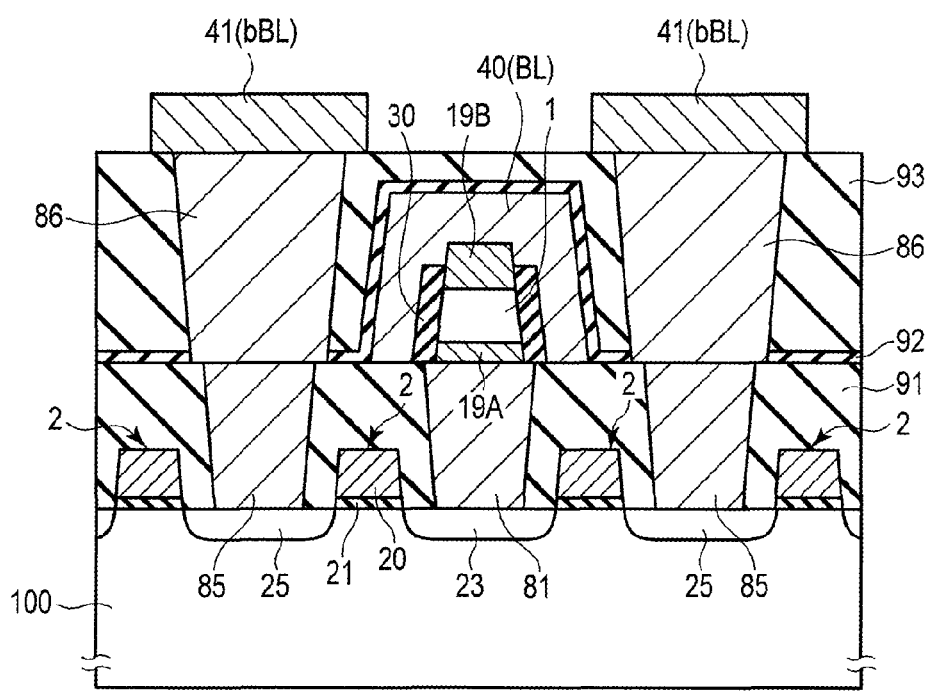
F I G. 24

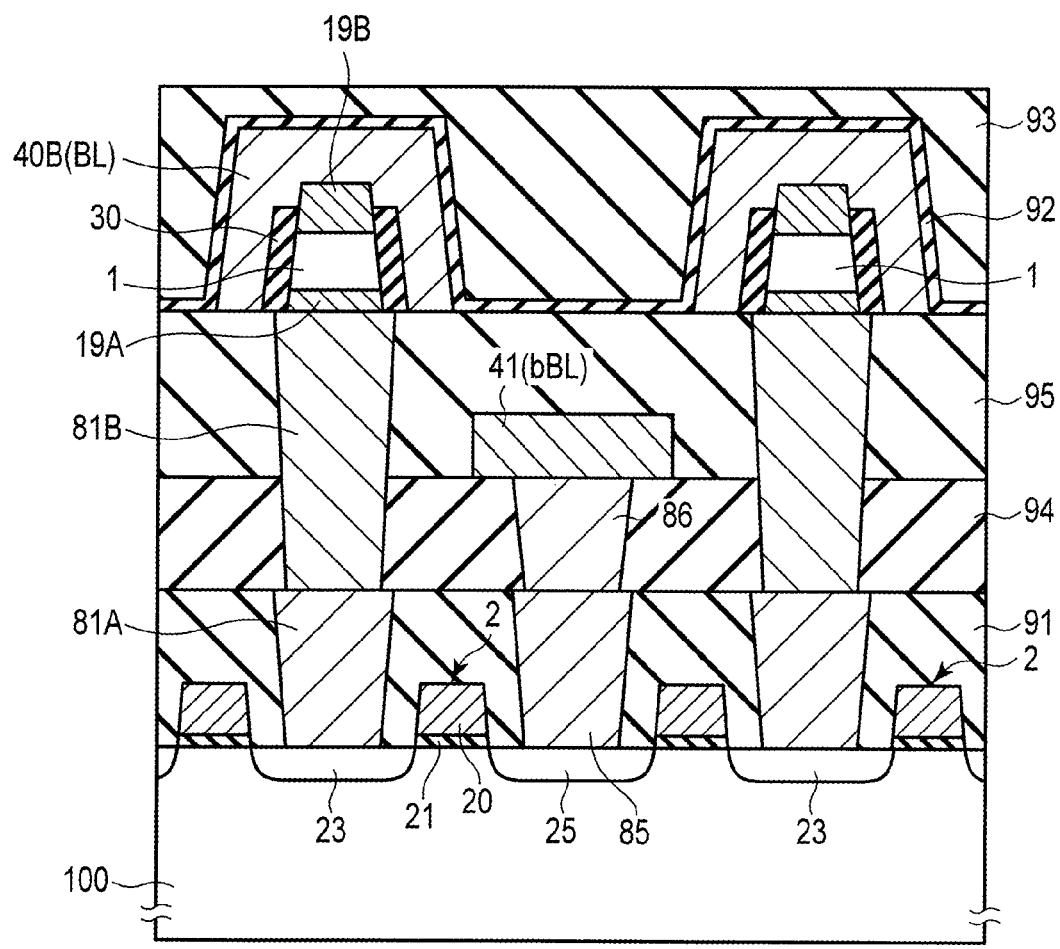
F I G. 26

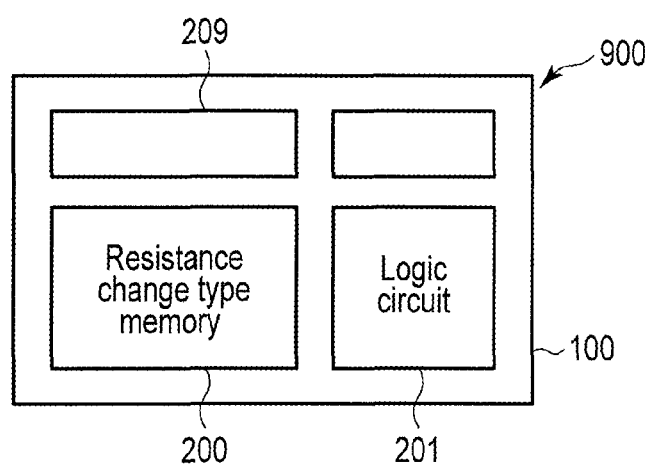
F I G. 29

RESISTANCE CHANGE TYPE MEMORY AND MANUFACTURING METHOD THEREOF

CROSS-REFERENCE TO RELATED APPLICATIONS

This application is based upon and claims the benefit of priority from Japanese Patent Application No. 2012-200835, filed Sep. 12, 2012, the entire contents of which are incorporated herein by reference.

FIELD

Embodiments described herein relate generally to a resistance change type memory and a manufacturing method thereof.

BACKGROUND

Resistance change type memories, such as an MRAM (Magnetoresistive RAM), an ReRAM (Resistive RAM), and a PCRAM (Phase change RAM), attract attention as a next-generation semiconductor memory. In the resistance change type memories, an increase in storage density and reduction of power consumption can be achieved by miniaturization of a memory element.

However, miniaturization of the memory element involves the difficulty of forming a stable contact between the memory element and an interconnect or a contact plug, and a process margin decreases.

BRIEF DESCRIPTION OF THE DRAWINGS

FIG. 1 is a view illustrating a basic example of a resistance change type memory according to an embodiment;

FIG. 2 is a view illustrating the basic example of the resistance change type memory of the embodiment;

FIG. 11 is a sectional process chart illustrating a process of a method for manufacturing the resistance change type memory of the embodiment;

FIG. 12 is a sectional process chart illustrating a process of a method for manufacturing the resistance change type memory of the embodiment;

FIG. 17 is a view illustrating modifications of the resistance change type memory of the embodiment;

FIG. 18 is a view illustrating modifications of the resistance change type memory of the embodiment;

FIG. 19 is a view illustrating modifications of the resistance change type memory of the embodiment;

FIG. 20 is a view illustrating modifications of the resistance change type memory of the embodiment;

FIG. 21 is a view illustrating modifications of the resistance change type memory of the embodiment;

FIG. 22 is a view illustrating modifications of the resistance change type memory of the embodiment;

FIG. 23 is a view illustrating modifications of the resistance change type memory of the embodiment;

FIG. 24 is a view illustrating modifications of the resistance change type memory of the embodiment;

FIG. 26 is a view illustrating modifications of the resistance change type memory of the embodiment;

FIG. 29 is a view illustrating an application example of the resistance change type memory of the embodiment.

DETAILED DESCRIPTION

[Embodiment]

Figure 3:
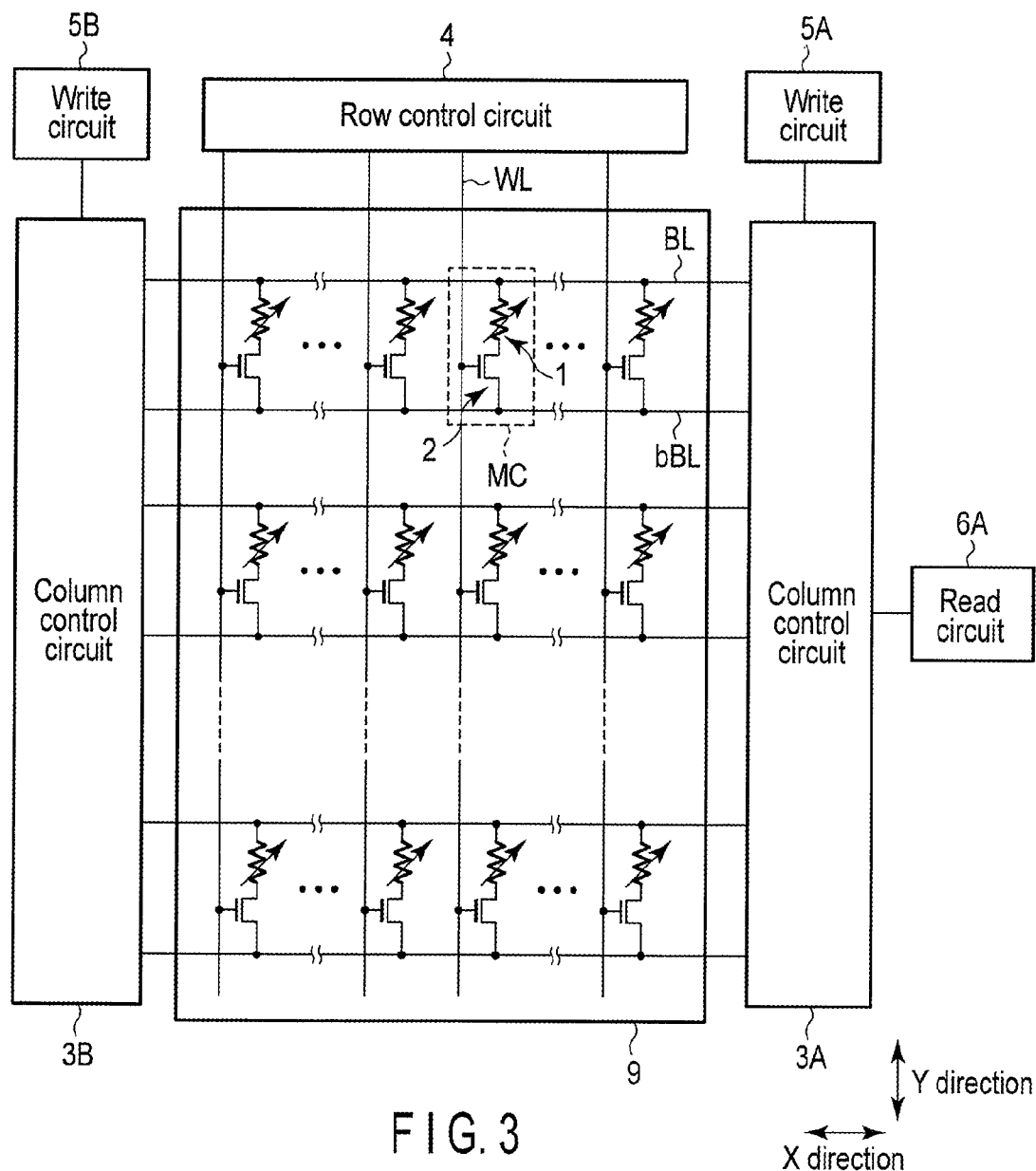
FIG. 3 is an equivalent circuit diagram illustrating an example of a circuit configuration of the resistance change type memory of the embodiment.

Hereinafter, an embodiment will be described with reference to the drawings. A component having the same function and configuration is designated by the same numeral in the following description, and an overlapping description is made as needed basis.

In general, according to one embodiment, a resistance change type memory includes a resistance change element provided on a first interlayer insulating film on a substrate and including a lower electrode and an upper electrode, being correlated at least two resistance states of the resistance change element and data to be stored with each other; a sidewall insulating film provided on a side surface of the resistance change element; a first plug provided in the first interlayer insulating film and connected to the lower electrode of the resistance change element; and a first interconnect provided on the first interlayer insulating film and connected to the upper electrode of the resistance change element, wherein the resistance change element is provided immediately above the first plug, the first interconnect covers the side surface of the resistance change element via the sidewall insulating film, and an upper surface of the first plug is covered with the lower electrode and the sidewall insulating film.

(1) Basic Example

A basic example of a resistance change type memory according to an embodiment will be described with reference to FIGS. 1 and 2.

The resistance change type memory of the embodiment includes a memory element formed by a resistance change element and an interconnect connected to the memory element.

FIG. 1 is a view illustrating a planar structure of the memory element and interconnect of the resistance change type memory. FIG. 2 is a view illustrating a sectional structure of the memory element and interconnect in a direction (a second direction) intersecting an interconnect extending direction (a first direction).

In a resistance change element 1 that is of a memory element 1, a resistance state changes from a high resistance state to a low resistance state or from the low resistance state to the high resistance state according to a supplied voltage or current. The changed resistance state of the element 1 is substantially maintained in a nonvolatile manner until the voltage or current, which changes the resistance state, is supplied to the element 1 again. The resistance change element 1 is used as the memory element, in which data of at least one bit can be stored, by correlating the resistance state of the resistance change element 1 with the data that should be stored.

As illustrated in FIGS. 1 and 2, the resistance change element 1 is provided on an interlayer insulating film 91 on a semiconductor substrate (not illustrated). The resistance change element 1 is provided immediately above a contact plug 81, and laid out such that the resistance change element 1 and the contact plug 81 overlap vertically with each other with respect to the direction perpendicular to the surface of the semiconductor substrate.

For example, the resistance change element 1 has a columnar structure. The resistance change element 1 has a circular planar shape, and the resistance change element 1 has a quadrangular sectional shape.

The resistance change element 1 is sandwiched between a lower electrode 19A and an upper electrode 19B. Hereinafter, the lower and upper electrodes 19A and 19B are occasionally described as a structural element of the resistance change element (the memory element). Hereinafter, a portion sandwiched between the two electrodes 19A and 19B in the resistance change element 1 is occasionally referred to as a resistance change portion or a resistance change film.

The resistance change element 1 is connected to the contact plug 81, which is buried in the interlayer insulating film 91, through the lower electrode 19A. The resistance change element 1 is connected to an interconnect 40 through the upper electrode 19B. The resistance change element 1 is connected to other elements and circuits, which are formed on the semiconductor substrate, through the contact plug 81 and the interconnect 40. For example, the contact plug 81 has a circular planar shape.

An insulating film 30 is provided on a side surface of the resistance change element 1. Hereinafter, the insulating film 30 on the side surface of the resistance change element 1 is referred to as a sidewall insulating film 30.

The sidewall insulating film 30 covers the whole side surface of the resistance change element 1. The sidewall insulating film 30 covers the whole side surface of the lower electrode 19A while covering the whole side surface of the resistance change element 1. The sidewall insulating film 30 covers a portion that is not in contact with the lower electrode 19A in the contact plug 81 (a portion that does not overlap with the resistance change element 1).

The sidewall insulating film 30 covers the side surface of the upper electrode 19B in the neighborhood of a boundary between the resistance change element 1 and the upper electrode 19B. On the other hand, the side surface of the upper electrode 19B on the side facing the boundary side between the resistance change element 1 and the upper electrode 19B is not covered with the sidewall insulating film 30, but is in contact with the interconnect 40.

As illustrated in FIG. 1, the interconnect 40 extends in the first direction.

The interconnect 40 covers an upper portion of the resistance change element 1 via the upper electrode 19B, and the interconnect 40 covers the side surface of the resistance change element 1 via the sidewall insulating film 30. The sidewall insulating film 30 is provided between the interconnect 40 and the lower electrode 19A and between the interconnect 40 and the contact plug 81. By the sidewall insulating film 30, the interconnect 40 is not in contact with the lower electrode 19A and the contact plug 81.

In the embodiment, as illustrated in FIG. 1, a dimension (maximum dimension) D1 of the resistance change element 1 having the circular planar shape is less than a dimension (diameter) D2 of the contact plug 81 having the circular planar shape with respect to the direction parallel to the surface of the semiconductor substrate.

The sidewall insulating film 30 has a thickness T1 in the direction parallel to the surface of the semiconductor substrate (the direction perpendicular to the side surface of the resistance change element 1).

A total value DX of the dimension D1 of the resistance change element 1 in the direction parallel to the surface of the semiconductor substrate and double the thickness of the sidewall insulating film 30 covering the side surface of the resistance change element 1 is "D1+2×T1". The dimension DX of the resistance change element 1 and sidewall insulating film 30 in the direction parallel to the surface of the semiconductor substrate is greater than the dimension D2 (>D1) of the contact plug 81.

In the embodiment, a short circuit between the interconnect 40 and the contact plug 81 (and the lower electrode 19A) can be prevented because of the relationship among the dimensions D1, D2, and DX, though the interconnect 40 covers the side surface of the resistance change element 1.

In the embodiment, the memory element 1 formed by the resistance change element has a structure in which the memory element 1 is provided in the interconnect 40. Therefore, a stable electrical contact between the fine memory element 1 and interconnect 40 can be ensured with no use of a complicated, difficult manufacturing process.

(2) Example

An example of the resistance change type memory of the embodiment will be described with reference to FIGS. 3 to 16.

(a) Structure

A structural example of the resistance change type memory of the embodiment will be described with reference to FIG. 3.

FIG. 3 is an equivalent circuit diagram illustrating a memory cell array included in the resistance change type memory of the embodiment and a circuit configuration in the neighborhood of the memory cell array.

As illustrated in FIG. 3, a memory cell array 9 of the resistance change type memory includes plural memory cells MC. The memory cells MC are two-dimensionally arrayed in the memory cell array 9. Plural bit lines BL and bBL and plural word lines WL are provided in the memory cell array 9. The bit lines BL and bBL extend in an X-direction (a column direction), and the word line WL extends in a Y-direction (a row direction). The bit lines BL and bBL form a pair of bit lines.

The memory cell MC is connected to the bit lines BL and bBL and the word line WL.

The plural memory cells MC arrayed in the X-direction are connected to the common pair of bit lines BL and bBL. The plural memory cells MC arrayed in the Y-direction are connected to the common word line WL.

For example, the memory cell MC includes one memory element 1 and one selection switch 2.

As described above, the memory element 1 is the resistance change element 1.

For example, the selection switch 2 is a field effect transistor. Hereinafter, the field effect transistor that is of the selection switch 2 is referred to as a select transistor 2. The resistance change element 1 is selected as an operating target by the select transistor 2 in an on state, and the resistance change element 1 is put into a non-operating state by the select transistor 2 in an off state.

One end of the resistance change element 1 is connected to the bit line BL, and the other end of the resistance change element 1 is connected to one end (a source/drain) of a current path of the select transistor 2. The other end (the drain/source) of the current path of the select transistor 2 is connected to the bit line bBL. A control terminal (gate) of the select transistor 2 is connected to the word line WL.

Column control circuits 3A and 3B are provided in the same chip as the memory cell array 9 so as to be adjacent to the memory cell array 9 in the X-direction.

The column control circuits 3A and 3B control a column of the memory cell array 9. The column control circuits 3A and 3B are connected to one end and the other end of each of the bit lines BL and bBL. The column control circuits 3A and 3B control activation/deactivation of the bit lines BL and bBL based on an external address signal.

A row control circuit 4 is provided in the same chip as the memory cell array 9 so as to be adjacent to the memory cell array 9 in the Y-direction.

The row control circuit 4 controls a row of the memory cell array 9. The row control circuit 4 is connected to one end of the word line WL. The row control circuit 4 controls the activation/deactivation of the word line WL based on the external address signal.

The memory cell activated (selected) by the column control circuits 3A and 3B and row control circuit 4 is accessed as the memory cell of the operating target from the outside (a memory controller or a host). Hereinafter, the memory cell selected as the operating target is referred to as a selected cell.

In the neighborhood of the memory cell array 9, write circuits 5A and 53 and a read circuit 6A are provided in the same chip as the memory cell array 9.

The write circuits 5A and 5B are connected to one end and the other end of each of the bit lines BL and bBL through the column control circuits 3A and 3B. Each of the write circuits 5A and 5B includes a source circuit, such as a current source and a voltage source, which generates a current or a voltage to change the resistance state of the resistance change element and a sink circuit that absorbs the current.

The read circuit 6A is connected to one end of each of the bit lines BL and bBL through the column control circuit 3A. The read circuit 6A includes a current source or voltage source that generates a current or a voltage to determine the resistance state of the resistance change element 1, a sense amplifier that senses and amplifies a read signal (a fluctuated current value or voltage value), and a latch circuit that temporarily retains the data.

For example, a circuit (hereinafter referred to as a peripheral circuit) except the row/column control circuits 4, 3A, and 3B, the write circuits 5A and 5B, and the read circuit 6A may be provided in the same chip as the memory cell array 9. For example, a buffer circuit, a state machine (a control circuit), or an ECC (Error Checking and Correcting) circuit is provided as the peripheral circuit in the chip. A logic circuit having a predetermined function may be provided in the same chip as the resistance change type memory to form a system LSI including the resistance change type memory and the logic circuit.

A structure of the resistance change type memory of the embodiment will be described with reference to FIGS. 4 to 8.

Figure 4:
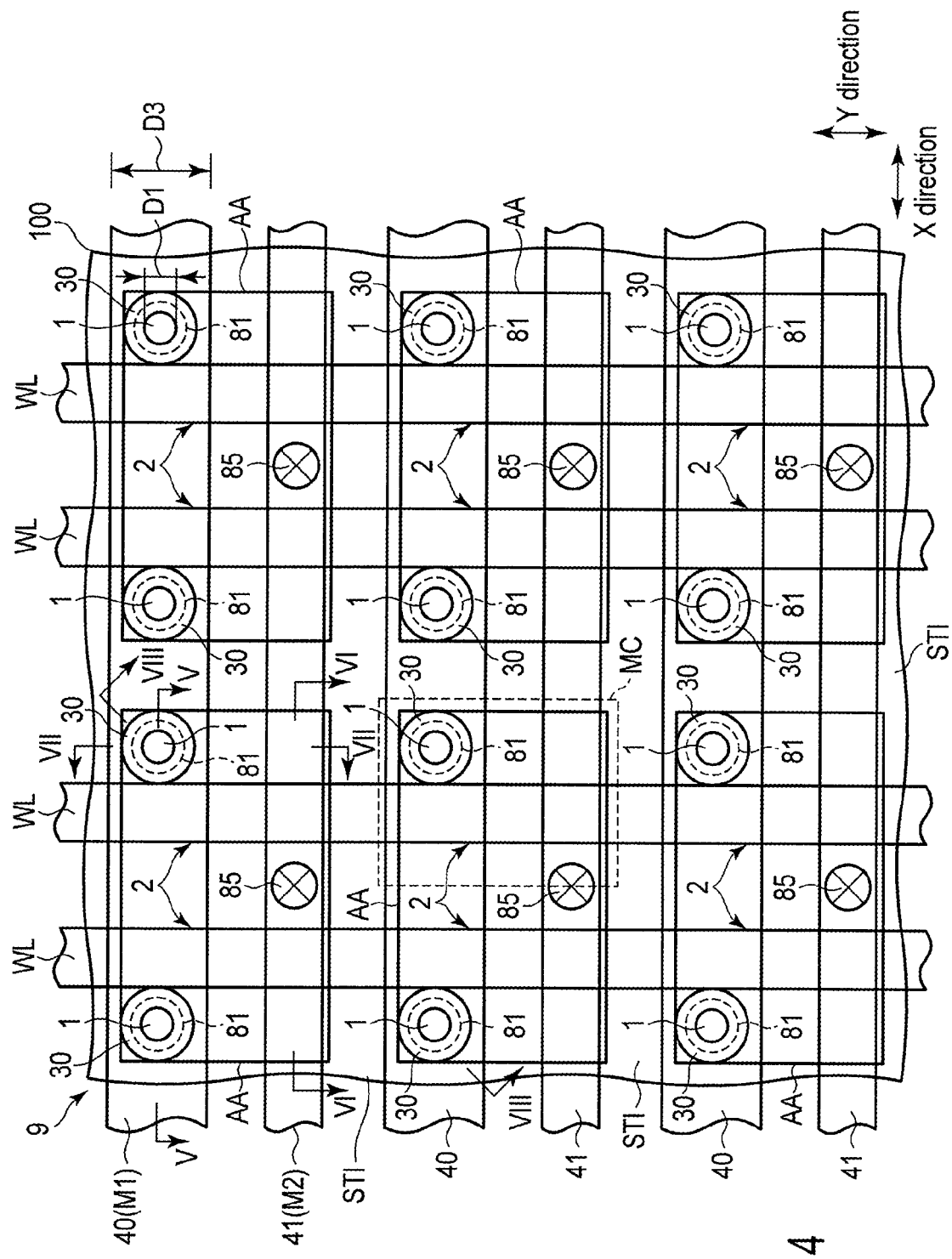
FIG. 4 is a plan view illustrating a structural example of a memory cell array of the resistance change type memory of the embodiment.

FIG. 4 is a plan view illustrating an example of a layout of the memory cell in the memory cell array of the resistance change type memory of the embodiment.

Figure 5:
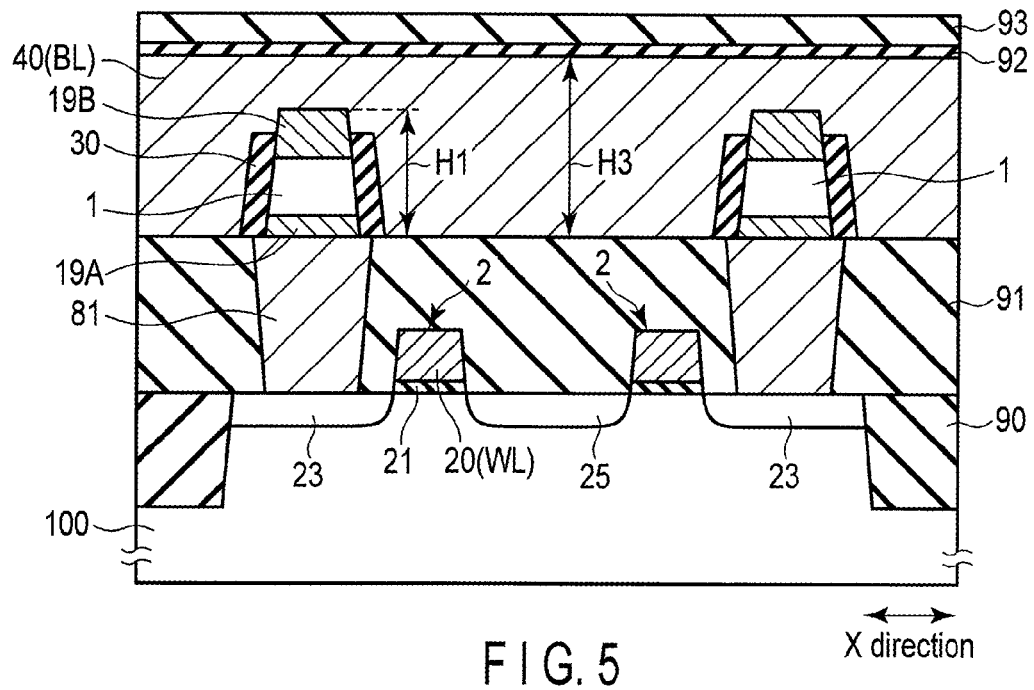
FIG. 5 is a sectional view illustrating a structural example of a memory cell array of the resistance change type memory of the embodiment.
Figure 6:
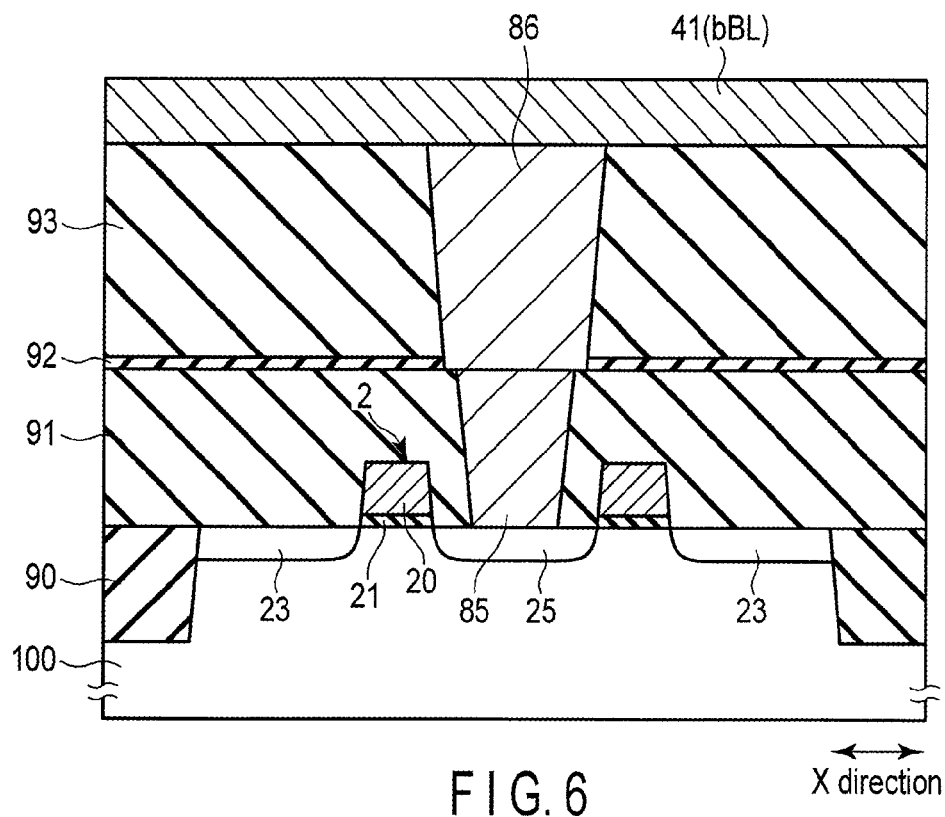
FIG. 6 is a sectional view illustrating a structural example of a memory cell array of the resistance change type memory of the embodiment.
Figure 7:
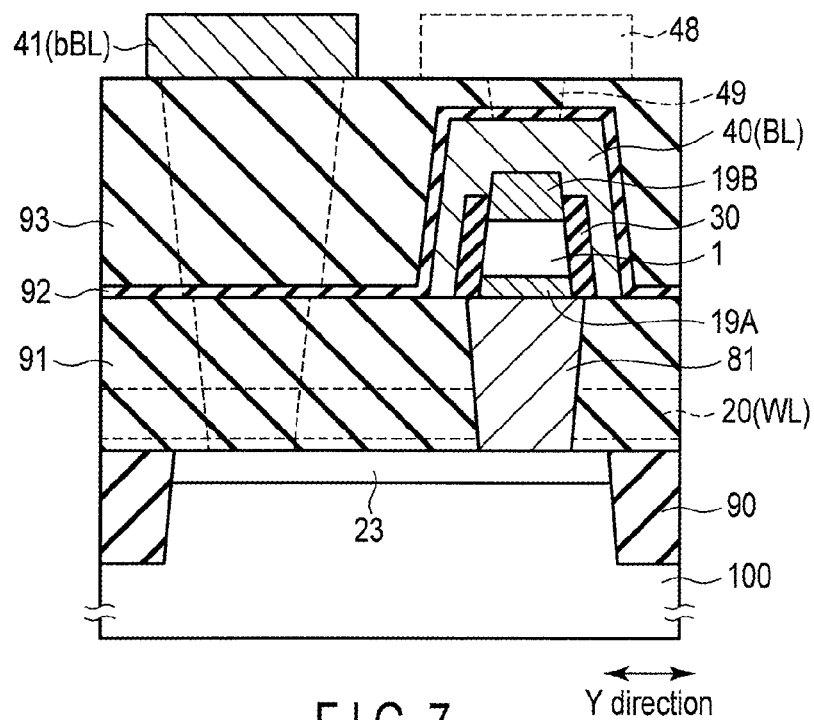
FIG. 7 is a sectional view illustrating a structural example of a memory cell array of the resistance change type memory of the embodiment.
Figure 8:
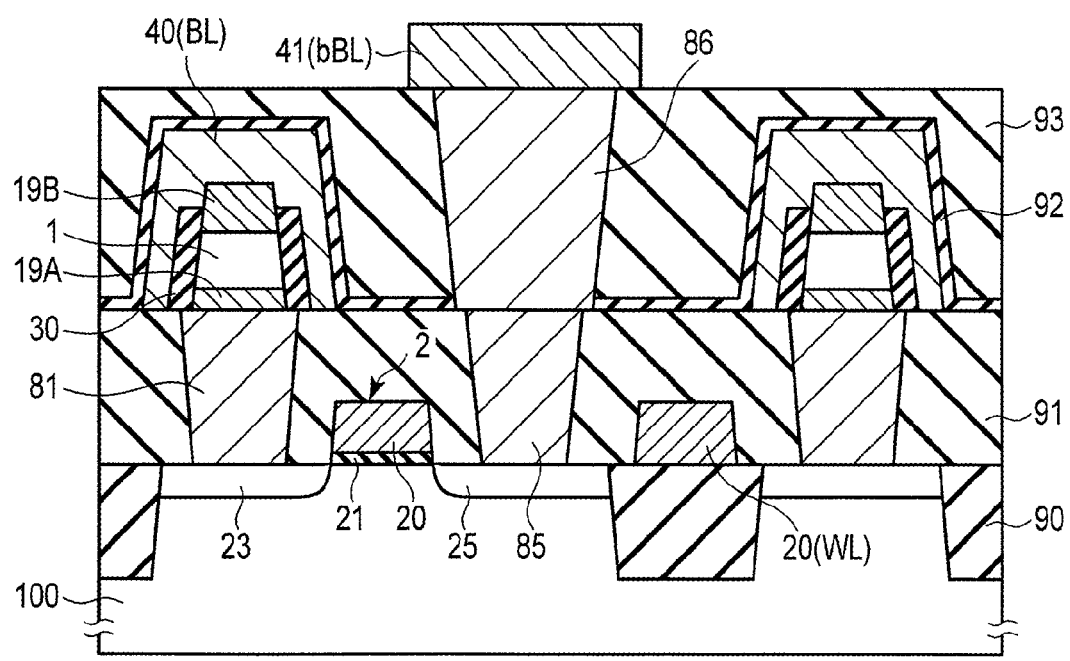
FIG. 8 is a sectional view illustrating a structural example of a memory cell array of the resistance change type memory of the embodiment.

FIG. 5 is a sectional view illustrating a sectional structure taken on a line V-V of FIG. 4. FIG. 6 is a sectional view illustrating a sectional structure taken on a line VI-VI of FIG. 4. FIG. 7 is a sectional view illustrating a sectional structure taken on a line VII-VII of FIG. 4. FIG. 8 is a sectional view illustrating a sectional structure taken on a line VIII-VIII of FIG. 4. A member provided in front of or behind the sectional structure in FIG. 7 is illustrated by a dotted line.

As illustrated in FIG. 4, the plural memory cells MC are two-dimensionally arrayed in the memory cell array 9 in the X-direction and Y-direction.

Each of the memory cells MC is formed in an active region (a semiconductor region) AA provided in a semiconductor substrate 100. The active region AA is comparted by a shallow trench isolation region STI, and separated from another active region AA by the shallow trench isolation region STI. The active region AA has a quadrangular planar shape. The shallow trench isolation region STI is provided in the semiconductor substrate 100 so as to have a lattice-shaped planar layout.

The resistance change elements 1 that are of the memory elements 1 are laid out in the memory cell array 9 so as to be arrayed in the X-direction and Y-direction. A contact plug 85 is connected to the other end of the current path of the select transistor 2. The plural contact plugs 85 are laid out in the memory cell array 9 so as to be arrayed in the X-direction and Y-direction.

Bit lines 40 and 41 extend in the X-direction above the active region AA and shallow trench isolation region STI. In the two bit lines 40 and 41 forming the pair of bit lines, the one bit line 40 is laid out in the memory cell array 9 so as to overlap with the plural resistance change elements 1 arrayed in the X-direction in the direction perpendicular to the surface of the semiconductor substrate 100. The other bit line 41 of the pair of bit lines is laid out in the memory cell array 9 so as to overlap with the plural contact plugs 85 arrayed in the X-direction in the direction perpendicular to the surface of the semiconductor substrate 100.

The word line WL extends in the Y-direction on the active region AA and shallow trench isolation region STI, and intersects the plural active regions AA arrayed in the Y-direction.

In FIG. 4, two memory cells MC are provided in one active region AA. Two resistance change elements 1 and two select transistors 2 are provided in one active region AA.

For example, one active region AA intersects two word lines WL. Two word lines WL intersecting a certain active region AA are laid out so as to be sandwiched in the X-direction between two resistance change elements 1 provided in the active region AA.

The two resistance change elements 1 are provided at a corner on one end side and a corner on the other end side of the quadrangular active region AA in the X-direction below the bit line 40.

The contact plug 85 connected to the bit line 41 is provided below the bit line 41. The contact plug 85 is laid out between the two word lines WL intersecting the active region AA. The contact plug 85 connected to the bit line 41 is provided in the direction oblique to the X-direction and Y-direction with respect to the resistance change element 1 connected to the bit line 40.

The contact plug 85 is provided in the active region AA where the two memory cells MC are provided. The contact plug 85 is shared by the two memory cells MC in order to reduce a cell size. Hereinafter, for the sake of clear understanding, the contact plug 85 shared by the two memory cells MC is referred to as a shared contact plug 85.

The select transistor 2 is provided at a position where the word line WL and the active region AA intersect each other.

As illustrated in FIGS. 5 and 8, a gate electrode 20 of the select transistor 2 is used as the word line WL. The gate electrode 20 that is of the word line WL extends in the Y-direction, and is used as a common gate 20 of the plural select transistors 2 arrayed in the Y-direction. The gate electrode 20 is provided on the active region AA, and provided on a shallow trench isolation insulating film 90 in the shallow trench isolation region STI.

The gate electrode 20 of the select transistor 2 is provided above a channel region between source/drains 23 and 25 of the transistor 2 through a gate insulating film 21 on the active region. The source/drains 23 and 25 of the select transistor are formed by diffusion layers (hereinafter referred to as source/drain diffusion layers) 23 and 25 provided in the active region AA.

In the case that the layout of the memory cell array 9 in FIG. 4 is used, the memory cell MC has a dimension 3F in the X-direction and a dimension 4F in the Y-direction. In the memory cell array 9 in FIG. 4, each memory cell has a cell size of $12F^2$.

The select transistor 2 is covered with the interlayer insulating film 91 on the semiconductor substrate 100.

The contact plugs 81 and 85 are provided in a contact hole made in the interlayer insulating film 91.

The contact plug 81 is provided on the source/drain diffusion layer 23 that is one end of the current path of the select transistor 2. The shared contact plug 85 is provided on the source/drain diffusion layer 25 that is the other end of the current path of the select transistor 2.

The source/drain diffusion layer 25 connected to the shared contact plug 85 is shared by the two select transistors 2 like the contact plug 85. Hereinafter, the source/drain diffusion layer 25 shared by the two select transistors 2 is also referred to as a shared source/drain diffusion layer 25.

The resistance change element 1 that is of the memory element and the lower and upper electrodes 19A and 19B are provided on the contact plug 81 in the interlayer insulating film 91. The contact plug 81 connected to the source/drain diffusion layer 23 of the select transistor 2 is connected to the lower electrode 19A of the resistance change element (the memory element) 1. Therefore, the resistance change element 1 and the current path of the select transistor 2 are connected to each other.

The sidewall insulating film 30 is provided on the side surface of the resistance change element 1. The sidewall insulating film 30 is provided on the side surface of the lower electrode 19A, and partially provided on the side surface of the upper electrode 19B.

For example, the sidewall insulating film 30 is made of an insulator, such as aluminum oxide ($AlO_x$) and silicon nitride (SiN).

The interconnect 40 that is of the bit line BL is provided on the interlayer insulating film 91 and resistance change element 1 so as to extend in the X-direction. For example, one of conductors, such as tungsten (W), titanium (Ti), titanium nitride (TiN), a stacked film of Ti and TiN, aluminum (Al), and molybdenum (Mo) is selected as a material for the interconnect 40. Preferably the interconnect 40 is made of a material that can be processed by RIE (Reactive Ion Etching).

The side surfaces of the resistance change element (memory element) 1 and lower electrode 19A are covered with the sidewall insulating film 30. The upper electrode 19B of the resistance chance element 1 is covered with the interconnect 40 that is of the bit line BL.

The whole side surfaces of the resistance change element 1 and lower electrode 19A are covered with the interconnect 40 with the sidewall insulating film 30 interposed therebetween. The side surface of the resistance change element 1 is not in direct contact with the interconnect 40.

An upper edge of the sidewall insulating film 30 is located above the boundary between the upper electrode 19B and the resistance change element 1 (on the opposite side of the semiconductor substrate side). The neighborhood of the boundary between the upper electrode 19B and the resistance change element 1 is covered with the sidewall insulating film 30. A certain portion of the upper electrode 19B covered with the sidewall insulating film 30 is not in contact with the interconnect 40. The remaining portion of the upper electrode 19B, which is not covered with the sidewall insulating film 30, is in contact with the interconnect 40. In order to decrease a contact resistance between the interconnect 40 and the upper electrode 19B, preferably the side surface of the upper electrode 19B is in contact with the interconnect 40 in addition to the upper surface of the upper electrode 19B. However, at least the upper surface of the upper electrode 19B may be in contact with the interconnect 40 in order to ensure the contact between the resistance change element 1 and the interconnect 40.

The sidewall insulating film 30 is provided between the interconnect 40 and the contact plug 81. A portion of the upper surface of the contact plug 81, which is not in contact with the resistance change element 1 (the lower electrode 19A), is covered with the sidewall insulating film 30.

The interconnect 40 is electrically separated from the side surface of the resistance change element 1 by the sidewall insulating film 30. The sidewall insulating film 30 prevents the interconnect 40 from being in direct contact with the lower electrode 19A and contact plug 81. Additionally, the sidewall insulating film 30 is provided to prevent impurities, such as hydrogen, oxygen, and carbon, from diffusing into the resistance change element 1 in forming the interlayer insulating film 91 covering the resistance change element 1.

The interconnect width (the dimension in the Y-direction) D3 of the interconnect 40 is greater than maximum dimensions of the resistance change element 1 including the lower and upper electrodes 19A and 19B and the contact plug 81. A thickness (a dimension from the upper surface of the interlayer insulating film 91 to the upper surface of the interconnect 40) H3 of the interconnect 40 in the direction perpendicular to the semiconductor substrate surface is greater than a height H1 of the resistance change element 1 including the lower and upper electrodes 19A and 19B. The interconnect 40 has a tapered sectional shape, and a dimension of a bottom surface of the interconnect 40 is greater than a dimension of the upper surface of the interconnect 40.

A protective film (interlayer insulating film) 92 is provided on the interconnect 40 and interlayer insulating film 91 so as to cover the interconnect 40. An interlayer insulating film 93 is provided on the interconnect 40 and interlayer insulating film 91 with the protective film 92 interposed therebetween. The resistance change element 1 is covered with the interlayer insulating film 93 while the interconnect 40 and the protective film 92 are interposed between the resistance change element 1 and the interlayer insulating film 93.

A contact plug (via plug) 86 is buried in a contact hole of the interlayer insulating film 93 so as to be connected to the shared contact plug 85. The via plug 86 is provided at the same interconnect level as the resistance change element 1 and interconnect 40.

The interconnect 41 that is of the bit line bBL is provided on the interlayer insulating film 93 and via plug 86 so as to extend in the X-direction.

The source/drain diffusion layer 25 of the select transistor 2 is connected to the interconnect 41 that is of the bit line bBL through the two contact plugs 85 and 86.

Thus, the two interconnects 40 and 41 forming the pair of bit lines BL and bBL are provided at the interconnect levels different from each other. The interconnects 40 and 41 may be made of the same material or different materials.

For example, an interconnect (backing interconnect) 48 connected to the bit line BL (40) on the lower layer side is provided at the same interconnect level as the bit line bBL (41) on the upper layer side, namely, on the interlayer insulating film 93. The interconnect 48 is connected to the bit line BL (40) on the lower layer side through the contact plug (via plug) 86 provided in the interlayer insulating film 93 in an end portion in the Y-direction of the memory cell array or at a predetermined location distant from in the memory cell array.

The two bit lines forming the pair of bit lines may be provided at the same interconnect level.

Figure 9:
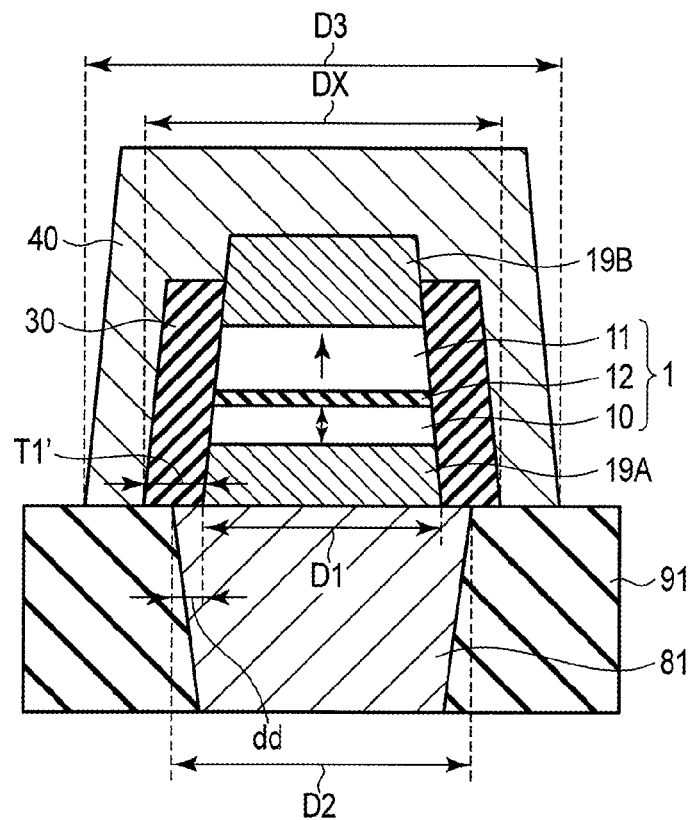
FIG. 9 is a sectional view illustrating an example of a memory element included in the resistance change type memory of the embodiment.

FIG. 9 illustrates an example of the resistance change element 1 used for the memory element of the resistance change type memory. In the case that the resistance change type memory is a magnetic memory (for example, an MRAM), a magneto-resistance effect element is used as the resistance change element 1 that is of the memory element. Because the resistance change element 1 of the example has substantially the same planar shape as the structure in FIG. 1, the drawing is omitted.

The magneto-resistance effect element 1 that is of the memory element 1 is an MTJ element 1 including a magnetic tunnel junction.

The MTJ element 1 includes a magnetic layer (hereinafter referred to as a storage layer) 10 in which a magnetization orientation is variable, a magnetic layer (hereinafter referred to as a reference layer) 11 in which the magnetization orientation is in a fixed state (invariable), and a non-magnetic layer (hereinafter referred to as a tunnel barrier layer) 12 located between the magnetic layers 10 and 11.

The resistance state (a resistance value) of the MTJ element 1 changes according to a relative relationship between the magnetization orientations of the magnetic layers 10 and 11. The MTJ element 1 is used as the memory element in which the data of at least one bit is stored by allocating the data (0 or 1) to be stored to at least the two resistance states.

The MTJ element 1 in FIG. 9 has a top-pin type structure. That is, in the MTJ element 1, the storage layer 10 is provided on the lower electrode 19A, and the reference layer 11 is stacked on the storage layer 10 with the tunnel barrier layer 12 interposed therebetween. The upper electrode 19B is stacked on the reference layer 11.

The order in which the storage layer 10 and the reference layer 11 are stacked is not limited to the order in FIG. 9. For example, like a bottom-pin type MTJ element, the reference layer may be stacked on the lower electrode 19A, and the storage layer may be stacked on the reference layer with the tunnel barrier layer interposed therebetween.

As illustrated in FIG. 9, the magnetization of each of the reference layer 11 and storage layer 10 is oriented toward the direction perpendicular to film surfaces (a magnetic layer stacking direction) of the magnetic layers 10 and 11. That is, the MTJ element 1 in FIG. 9 is a perpendicular magnetization type MTJ element.

At least one magnetic layer selected from materials, such as a ferromagnetic material having an $L1_0$ structure or an $L1_1$ structure (for example, FePd, FePt, and CoPd), a magnetic alloy (for example, a Co—Fe alloy and CoFeB), a ferrimagnetic material (for example, TbCoFe), and an artificial lattice is used as the storage layer 10 and reference layer 11. For example, the tunnel barrier layer 12 is made of MgO.

A parallel magnetization type MTJ element is used as the memory element 1. The parallel magnetization type MTJ element is formed such that the magnetization of each of the storage layer 10 and reference layer 11 is oriented toward the direction parallel to the film surface of the magnetic layer.

The MTJ element 1 may include magnetic layers (hereinafter referred to as interface layers) in a region near an interface between the storage layer 10 and the tunnel barrier layer 12 and in a region near an interface between the reference layer 11 and the tunnel barrier layer 12 in order to improve a characteristic of the MTJ element 1. The MTJ element 1 may include a magnetic layer (hereinafter referred to as a shift adjustment layer) in order to suppress an influence of a leakage magnetic field applied from the reference layer 11 to the storage layer 10.

Preferably the electrodes 19A and 19B that are in contact with the magnetic layers 10 and 11 have a function of improving the characteristic (for example, crystallinity of the magnetic layer) of the magnetic layer. According to the material used for the storage layer 10, the lower electrode 19A that is in contact with the storage layer 10 is made of a material including an atomic closed-packed plane or a material having a small spin pumping effect generated between the storage layer 10 and an underlaying layer (lower electrode). For example, at least one of materials, such as platinum (Pt), palladium (Pd), iridium (Ir), tungsten (W), tantalum (Ta), and hafnium (Hf), is used as the material including the atomic closed-packed plane. Nitride or boride is used as the material having the small spin pumping effect. For example, the upper electrode 19B is made of W, TiN, or Ta. The upper electrode 19B is used as a hard mask in patterning the MTJ element 1.

In the case that the MTJ element is used as the memory element 1 of the resistance change type memory like the embodiment, for example, the data is written in the memory element 1 (a change in resistance state of the MTJ element) by Spin-Transfer Torque (hereinafter abbreviated to as STT). In the MTJ element 1 that is of the memory element, the relative magnetization orientations of the storage layer 10 and reference layer 11 are reversed by the STT.

The magnetization orientation of the storage layer 10 in the MTJ element 1 is changed by a spin torque generated by a write current supplied to the MTJ element 1. That is, a spin-polarized electron included in the write current acts on the magnetization (the spin) of the storage layer 10, thereby changing the magnetization orientation of the storage layer 10.

As used herein, in the STT, "the magnetization orientation of the reference layer is in the fixed state" or "the magnetization orientation of the reference layer is invariable" means that the magnetization orientation of the reference layer 11 does not change when a current (a magnetization reversal current) which is equal to or more than a magnetization reversal threshold in order to reverse the magnetization orientation of the storage layer 10 is passed through the reference layer 11.

In the MTJ element 1, the magnetic layer having the large magnetization reversal threshold is used as the reference layer 11, and the magnetic layer having the magnetization reversal threshold less than that of the reference layer 11 is used as the storage layer 10. Therefore, the MTJ element 1 including the storage layer 10 in which the magnetization orientation is variable and the reference layer 11 in which the magnetization orientation is fixed is formed.

The write current has a current value that is greater than or equal to the magnetization reversal threshold of the storage layer 10 and is less than the magnetization reversal threshold of the reference layer 11.

In the case that the magnetization orientation of the storage layer 10 is changed to a state parallel (P) to the magnetization orientation of the reference layer 11, namely, in the case that the magnetization orientation of the storage layer 10 is identical to that of the reference layer 11, the write current passed from the storage layer 10 toward the reference layer 11 is supplied to the MTJ element 1.

Most of the electrons moving from the reference layer 11 to the storage layer 10 through the tunnel barrier layer 12 have the same magnetization (spin) orientation as the reference layer 11. The magnetization of the storage layer 10 is reversed to have the same orientation as the reference layer 11 by a spin angular momentum (the spin torque) of the spin-polarized electron.

When the magnetization of the MTJ element 1 has a parallel array (the parallel state), the resistance value of the MTJ element 1 becomes the minimum.

When magnetization orientation of the storage layer 10 is changed to a state antiparallel (AP) to the magnetization orientation of the reference layer 11, namely, in the case that the magnetization orientation of the storage layer 10 is opposite to that of the reference layer 11, the write current passed from the reference layer 11 toward the storage layer 10 is supplied to the MTJ element 1.

Of the electrons moving from the storage layer 10 toward the reference layer 11, the electron having the spin antiparallel to the magnetization orientation of the reference layer 11 is reflected by the reference layer 11. The spin torque of the reflected electron (the spin-polarized electron) is applied to the magnetization of the storage layer 10, whereby the magnetization of the storage layer 10 is reversed, i.e., is in the opposite direction to the magnetization orientation of the reference layer 11.

When the magnetization of the MTJ element 1 has an antiparallel array (the antiparallel state), the resistance value of the MTJ element 1 becomes the maximum.

In the STT-MRAM, in writing the data, the write circuits 5A and 5B supply the write current to the MTJ element 1 that is of the selected cell of the write target. The write circuits 5A and 5B bi-directionally pass the write current through the MTJ element 1 of the memory cell MC according to the data written in the selected cell. That is, according to the write data, the write current from the bit line BL toward the bit line bBL or the write current from the bit line bBL toward the bit line BL is output from the write circuits 5A and 5B to the MTJ element 1.

The data is read (the determination of the resistance state) from the MTJ element 1 that is of the memory element by passing the current through the MTJ element 1. The read current used to read the data from the MTJ element 1 (the determination of the resistance state) is set to a current value less than the current value (the magnetization reversal threshold) of the write current such that the magnetization of the storage layer 10 is not reversed by the read current. For example, the read current is supplied from the read circuit 6A to the MTJ element 1 selected as the read target, and the current value and a potential variation at a read node are sensed and amplified by the read circuit 6A. Therefore, whether the MTJ element 1 is in a state in which the "0" data is retained (for example, the parallel state or the low resistance state) or a state in which "1" data is retained (for example, the antiparallel state or the high resistance state) is determined.

For example, the MTJ element 1 has a tapered (trapezoidal) sectional shape, in which the dimension in the upper portion of the MTJ element 1 is less than the dimension in the lower portion of the MTJ element 1, according to the height (the dimension in the direction perpendicular to the surface of the semiconductor substrate 100) of the lower and upper electrodes 19A and 19B and the MTJ element 1.

In FIG. 9, the dimension of the MTJ element 1 on the upper electrode side (the upper portion side) is less than the dimension in the lower portion of the MTJ element 1 on the lower electrode side (the bottom portion side) with respect to the dimension of the MTJ element 1 in the direction parallel to the surface of the semiconductor substrate 100.

The contact plug 81 connected to the lower electrode 19A of the MTJ element 1 has the tapered sectional shape according to the thickness of the interlayer insulating film 91 or an aspect ratio of the contact hole in which the contact plug 81 is buried.

The dimension of the contact plug 81 on the side of the MTJ element 1 (the upper portion side) is greater than the dimension of the contact plug 81 on the select transistor side (the bottom portion side or the semiconductor substrate side) with respect to the dimension of the contact plug 81 in the direction parallel to the surface of the semiconductor substrate 100.

The MTJ element 1 including the lower and upper electrodes 19A and 19B is provided immediately above the contact plug 81, and electrically directly connected to the contact plug 81.

As described above with reference to FIGS. 1 and 2, in the embodiment, the dimension D1 of the resistance change element (in this case, the MTJ element) 1 in the direction parallel to the surface of the semiconductor substrate is less than the dimension D2 of the contact plug 81 in the direction parallel to the surface of the semiconductor substrate. Therefore, the upper surface of the contact plug 81 includes a portion that is not in contact with the MTJ element 1 (lower electrode 19A).

The reduction of the cell size and the decrease in power consumption of the memory cell are achieved by the miniaturization of the MTJ element 1 that is of the memory element. The size of the contact plug 81 is greater than that of the MTJ element 1 such that a connection failure (open) is not generated between the fine MTJ element 1 and select transistor 2.

In the case that the MTJ element 1 and the contact plug 81 have the tapered sectional shapes as illustrated in FIG. 9, it is assumed that the dimensions D1 and D2 of the MTJ element 1 and contact plug 81 in the direction parallel to the surface of the semiconductor substrate 100 are maximum dimensions of the MTJ element 1 and contact plug 81 in the direction parallel to the surface of the semiconductor substrate 100.

That is, in the MTJ element (the resistance change element) 1 having the tapered sectional shape, the maximum dimension D1 of the MTJ element 1 including the electrodes 19A and 19B is provided on the bottom portion side (the semiconductor substrate side) of the MTJ element 1. The bottom surface of the lower electrode 19A has the maximum dimension D1 of the MTJ element 1 in the direction parallel to the surface of the semiconductor substrate 100.

In the contact plug 81 having the tapered sectional shape, which is connected to the lower electrode 19A of the MTJ element 1, the maximum dimension D2 of the contact plug 81 is provided in the upper portion (the MTJ element side) of the contact plug 81. The upper surface of the contact plug 81 has the maximum dimension D2 of the contact plug 81 in the direction parallel to the surface of the semiconductor substrate 100.

The sidewall insulating film 30 having the thickness T1 is provided on the side surface of the MTJ element 1. The sidewall insulating film 30 covers a portion (an exposed portion) that does not overlap with the MTJ element 1 in the upper surface of the contact plug 81. The sidewall insulating film 30 is formed by methods, such as ALD (Atomic Layer Deposition), in which a relatively conformal film is formed. As a result, the sidewall insulating film 30 has the small variation of the thickness T1.

The MTJ element 1 is provided in the interconnect 40. The upper electrode 19B of the MTJ element 1 is in direct contact with the interconnect 40, whereby the interconnect 40 is connected in series with the MTJ element 1, the select transistor 2, and the interconnect 41. The dimension (the interconnect width) D3 of the interconnect 40 in the direction intersecting the interconnect extending direction is greater than the dimensions D1 and D2 of the MTJ element 1 and contact plug 81 in the direction intersecting the interconnect extending direction. The interconnect 40 covers the whole side surface of the MTJ element 1 with the sidewall insulating film 30 interposed therebetween.

The side surface of the MTJ element 1 is not in direct contact with the interconnect 40 by the sidewall insulating film 30 between the side surface of the MTJ element 1 and the interconnect 40. In the case that the dimension of the MTJ element 1 is less than the dimension of the contact plug 81 in the direction parallel to the surface of the semiconductor substrate like the embodiment, the sidewall insulating film 30 covers the portion that does not overlap with the resistance change element 1 in the upper surface of the contact plug 81, whereby the upper surface of the contact plug 81 is not in direct contact with the interconnect 40.

Thus, the sidewall insulating film 30 on the side surface of the MTJ element 1 prevents an unintended contact (the short circuit) between the MTJ element 1 and the interconnect 40 and an unintended contact between the contact plug 81 and the interconnect 40.

For example, in the direction parallel to the surface of the semiconductor substrate, the total value ($DX = D1 + 2 \times T1$) of the maximum dimension D1 of the MTJ element 1 and double the thickness T1 of the sidewall insulating film 30 is greater than the maximum dimension D2 (>D1) of the contact plug 81. The sidewall insulating film 30 is formed so as to satisfy the dimensional relationship, which prevents the short circuit among the MTJ element 1, the contact plug 81, and the interconnect 40.

On one of side surface sides of the MTJ element 1, there is a dimension difference dd between the MTJ element 1 and the contact plug 81.

In the case that center positions of the MTJ element 1 and the contact plug 81 coincide with each other, the dimension difference dd between the MTJ element 1 and the contact plug 81 becomes a half $(D2-D1)/2$ of the difference between the maximum dimensions D1 and D2 of MTJ element 1 and contact plug 81. In this case, the dimension differences dd on one side and the other side are equal to each other in relation to the center of the MTJ element 1. In this case, the sidewall insulating film 30 is formed such that the thickness T1 of the sidewall insulating film 30 is greater than the dimension difference dd.

However, a variation in dimension of the MTJ element 1, a variation in dimension of the contact plug 81, and a misalignment between the resistance change element 1 and the contact plug 81 are possibly generated due to a process variation in a process of manufacturing the resistance change type memory.

In the case that the misalignment between the MTJ element 1 and the contact plug 81 is generated, for example, an amount DS of the misalignment between the MTJ element 1 and the contact plug 81 ranges from about 10% to about 35%. In the case that the dimension of the resistance change element 1 (or the contact plug) is set to about 46 nm, misalignments of about 6 nm to about 15 nm are possibly generated.

In consideration of the variation in dimension or the misalignment in the manufacturing process, preferably the thickness T1 of the sidewall insulating film 30 is set such that the short circuit is not generated between the interconnect 40, which covers the side surface of the MTJ element 1, and the MTJ element 1 and contact plug 81.

For example, the thickness T1 of the sidewall insulating film 30 is formed so as to be greater than a total value of a square-root sum of square of the variation in dimension of the MTJ element 1, the variation in dimension of the contact plug 81 directly connected to the MTJ element 1, and the misalignment between the MTJ element 1 and the contact plug 81 and the dimension difference dd between the MTJ element and the contact plug.

In this case, a relationship of an expression 1 holds between the thickness T1 of the sidewall insulating film 30 and the total value of the square-root sum of square of the variations in dimension and the misalignment and the dimension difference dd. $T1 > (dd + (\sigma D1^2 + \sigma D2^2 + DS^2)^{1/2})$ (expression 1). In the relationship expression (expression 1) of the thickness T1 of the sidewall insulating film 30, "$\sigma$" is a deviation of each variation.

In the case that the sidewall insulating film 30 is provided on the inclined side surface of the tapered MTJ element 1, the dimension of the sidewall insulating film 30 in the direction parallel to the surface of the semiconductor substrate 100 does not coincide with the dimension (thickness) T1 of the sidewall insulating film 30 in the direction perpendicular to the inclined side surface of the MTJ element 1. Assuming that $\theta$ is a tapered angle formed between the side surface of the MTJ element 1 and the direction parallel to the surface of the semiconductor substrate 100, a dimension TD of the sidewall insulating film 30 in the direction parallel to the surface of the semiconductor substrate 100 can be expressed by $T1/\sin\theta$. In (expression 1), the thickness T1 may be replaced with the dimension TD of the sidewall insulating film 30 in the direction parallel to the surface of the semiconductor substrate 100.

In the embodiment, the resistance change element and the contact plug have the circular planar shapes. Alternatively, the resistance change element and the contact plug may have elliptical planar shapes or quadrangular planar shapes. In the case that the resistance change element and the contact plug have the elliptical planar shape, the maximum dimensions of the resistance change element and contact plug in the direction parallel to the surface of the semiconductor substrate 100 become dimensions of long axes of the ellipses. In the case that the resistance change element and the contact plug have the quadrangular planar shape, the maximum dimensions of the resistance change element and contact plug in the direction parallel to the surface of the semiconductor substrate 100 become dimensions of diagonals of the quadrangles. Even in the case that the MTJ element 1 and the contact plug have the quadrangular planar shapes or the elliptical planar shapes, the thickness of the sidewall insulating film 30 may be formed so as to satisfy the above relationship.

As described above, the resistance change element as the memory element included in the resistance change type memory of the embodiment is provided in the interconnect 40 with the sidewall insulating film 30 interposed therebetween such that the short circuit is not generated.

In the general resistance change type memory and the manufacturing method thereof, in the plural memory elements of the high-storage-density memory cell array, a height (thickness) of a metallic hard mask, which is used as the upper electrode in order to ensure the contact between the interconnect and the memory element, in the memory element having the finest dimension generated by the variations in a lithography process and processing process is lower than heights of the hard masks of other memory elements. In consideration of the lowered height (the decreased thickness) of the post-processing upper electrode, the stable electric contact with all the memory elements in the memory cell array is ensured by increasing the height (the thickness) of the metallic hard mask during deposition.

However, in the case that the height of the metallic hard mask is increased, the size (for example, the dimension in the direction parallel to the surface of the semiconductor substrate) of the post-processing memory element tends to be enlarged, and sometimes the increase in height of the hard mask is not preferable from the viewpoint of the miniaturization of the cell size.

Additionally, in the general resistance change type memory manufacturing process, the interlayer insulating film (for example, a silicon oxide film) and the interconnect are sequentially formed after the protective film is formed on the processed memory element. Therefore, in the resistance change type memory manufacturing process, the resistance change type memory is subjected to some manufacturing processes (a film deposition process and the processing process) until the upper electrode and the interconnect are in electric contact with each other. Possibly the process margin decreases as a result of the generation of the processing variation (for example, the variation in dimension) of the upper electrode (the metallic hard mask) or variations of the structural members, such as a variation in thickness of the insulating film covering the upper electrode of the memory element.

In the resistance change type memory of the embodiment, the resistance change element 1 that is of the memory element is provided in the interconnect 40 with the sidewall insulating film 30 interposed therebetween. The exposed portion (the portion that is not covered with the sidewall insulating film) of the upper electrode 19B of the resistance change element 1 is electrically connected to the interconnect 40.

In the process of manufacturing the resistance change type memory of the embodiment, after the sidewall insulating film 30 is formed on the side surface of the processed resistance change element 1, the interlayer insulating film is not formed so as to cover the resistance change element 1, but the interconnect 40 is formed so as to cover the resistance change element 1.

Thus, the number of manufacturing processes, which are performed until the resistance change element 1 and the interconnect 40 are electrically connected to each other, can be decreased in the resistance change type memory of the embodiment. As a result, the process margin can be improved during the resistance change type memory manufacturing process. In the resistance change type memory of the embodiment, it is not necessary to consider the processing variation, so that the resistance change element can be finely produced.

A component (an element) of the material or gas, which is used for the structural element (for example, the interlayer insulating film) after the resistance change element 1 that is of the memory element is processed, becomes the impurity with respect to the resistance change element 1 to possibly degrade the characteristic of the resistance change element 1.

For example, in the case that hydrogen or oxygen generated in depositing the interlayer insulating film passes through the protective film covering the MTJ element 1 that is of the memory element 1, the magnetic layer or tunnel barrier layer forming the MTJ element 1 is corroded by the passing hydrogen or oxygen to possibly degrade an element characteristic (for example, an MR ratio) of the MTJ element 1.

On the other hand, in the embodiment, the MTJ element 1 that is of the resistance change element is covered with the interconnect 40 made of metal while covered with the sidewall insulating film 30 that is of the protective film. As a result, impurities, such as hydrogen, oxygen, and carbon, can be prevented from diffusing in the MTJ element 1 in depositing the interlayer insulating film 93 after the MTJ element 1 and the interconnect 40 are formed. Accordingly, in the embodiment, the degradation of the characteristic of the MTJ element 1 can be suppressed, and the function of the memory element can be maintained.

For example, like the case that the data is written into the resistance change element 1, occasionally heat is generated in the resistance change element 1 by the current passed through the resistance change element 1. The generated heat possibly degrades the characteristic of the resistance change element 1, or destabilizes the operation of the resistance change element 1. For example, for the MTJ element 1, a thermal disturbance of the magnetic layer is possibly generated due to Joule heat. The thermal disturbance possibly destabilizes the write operation (the data retaining state immediately after the data write) or generates read disturb (the magnetization reversal caused by the read current).

On the other hand, in the embodiment, the resistance change element 1 is covered with the interconnect 40 made of a metal having a thermal conductivity higher than that of the insulator, thereby improving a radiation property of the heat generated in the resistance change element 1. As a result, an influence of the heat on the resistance change element 1 is decreased, and the degradation of the element characteristic can be suppressed, i.e., the element can operate stably.

In the case that the system LSI is formed using the resistance change type memory of the embodiment, the resistance change type memory of the embodiment and the logic circuit are formed on the same chip.

In the logic circuit of the system LSI, the thickness of the interlayer insulating film and the thickness (the height) of the interconnect at each interconnect level are defined in order to satisfy a specification (a tolerance) of an interconnect capacitance. Preferably, the number of change times of manufacturing process of the logic circuit is decreased in order to reduce production costs.

Therefore, in the case that the thicknesses of the interlayer insulating film and interconnect of the memory cell array differ from the defined values of the logic circuit in order to ensure the process margin of the resistance change type memory, there is generated a possibility that the memory cell array and the logic circuit are separately formed through different manufacturing processes.

As described above, the process margin can be improved by the structure in which the memory element (the resistance change element) 1 of the resistance change type memory is provided in the interconnect 40. Because the relatively fine memory element and the interconnect covering the memory element are provided in the interlayer insulating film at the same interconnect level, restrictions on the structure and process are relaxed at each interconnect level of the resistance change type memory. As a result, a degree of freedom of design of the interlayer insulating film is enhanced at each interconnect level of the resistance change type memory.

For this reason, the thicknesses of the interlayer insulating film and interconnect of the resistance change type memory can be adjusted to the specifications of the interlayer insulating film and interconnect of the logic circuit, and compatibility between the resistance change type memory of the embodiment and the logic circuit, which are provided in the same chip is improved. Therefore, the system LSI including the resistance change type memory of the embodiment can be provided without the complicated manufacturing process and the increased number of manufacturing processes or the production cost associated with the complication and the increased number of manufacturing processes.

As described above, according to the resistance change type memory of the embodiment, the high-reliability resistance change type memory can be provided by the relatively simple, and low-cost manufacturing process.

(b) Manufacturing Method

A method for manufacturing the resistance change type memory of the embodiment will be described below with reference to FIGS. 10 to 16. FIGS. 10 to 16 are sectional process views taken along a line VIII-VIII (a direction oblique to an X-Y plane) of FIG. 4.

Figure 10:
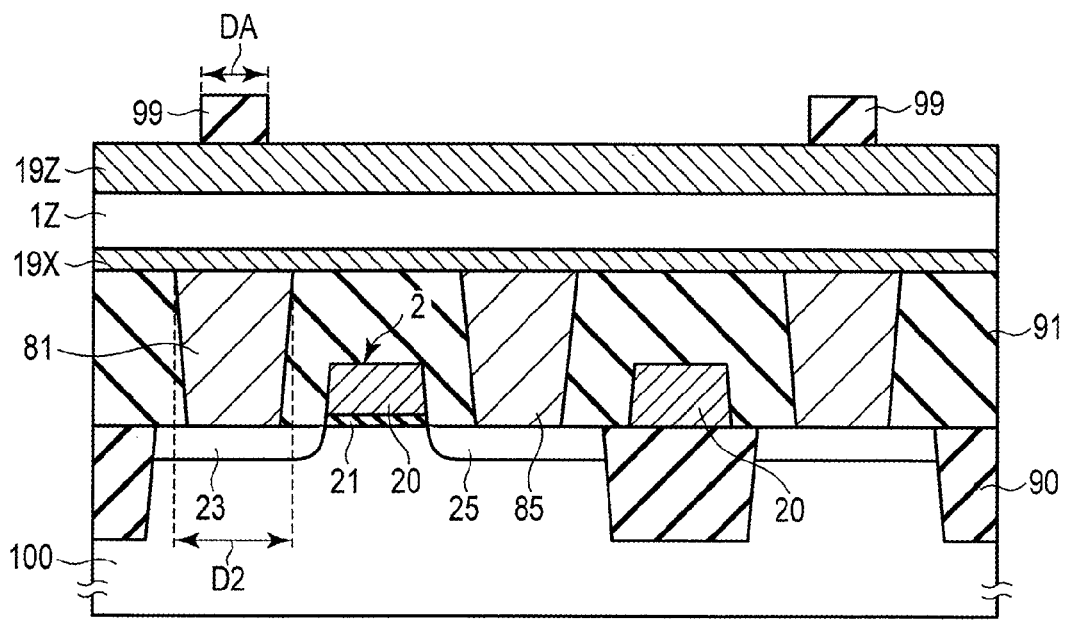
FIG. 10 is a sectional process chart illustrating a process of a method for manufacturing the resistance change type memory of the embodiment.

As illustrated in FIG. 10, the shallow trench isolation insulating film 90 having the STI (Shallow Trench Isolation) structure is buried in the semiconductor substrate 100 to form the shallow trench isolation region. The rectangular active region is comparted in the semiconductor substrate 100 by the formation of the shallow trench isolation region.

The select transistor 2 of the memory cell MC is formed on the active region of the semiconductor substrate 100. A select transistor forming process is performed as follows.

The gate insulating film 21 is formed on the active region surface. For example, the gate insulating film 21 is a silicon oxide film formed by a thermal oxidation method. Then, for example, the conductive layer (for example, a polysilicon layer) is formed on the gate insulating film 21 by a CVD (Chemical Vapor Deposition).

For example, the conductive layer is processed into a predetermined pattern by photolithography and the RIE. Therefore, the gate electrode 20 is formed on the gate insulating film 21. In order to use the gate electrode 20 as the word line, the gate electrode 20 is formed so as to extend in the Y-direction. The gate electrode 21 is formed so as to straddle the plural active regions arrayed in the Y-direction, and the gate electrode 21 is shared by the plural select transistors arrayed in the Y-direction.

The source/drain diffusion layers 23 and 25 are formed in the semiconductor substrate 100. Impurities, such as arsenic (As) and phosphorus (P) are implanted into the semiconductor substrate 100 by ion implantation with the gate electrode 21 as a mask, thereby forming the source/drain diffusion layers 23 and 25.

The select transistor 2 of the memory cell MC is formed on the semiconductor substrate 100 through the above processes. A process of forming a silicide layer on the upper surfaces of the gate electrode 20 and source/drain diffusion layers 23 and 25 may be added.

For example, the first interlayer insulating film 91 is deposited on the semiconductor substrate 100 by the CVD. The upper surface of the interlayer insulating film 91 is planarized by CMP (Chemical Mechanical Polishing).

The contact hole is made in the interlayer insulating film 91 so as to expose the upper surfaces of the source/drain diffusion layers 23 and 25. For example, the contact hole is filled with tungsten (W) or molybdenum (Mo) to form the contact plugs 81 and 85.

For example, the contact plugs 81 and 85 have the tapered sectional shapes according to the thickness of the interlayer insulating film 91 or the aspect ratio of the contact hole made in the interlayer insulating film 91.

A structural member (for example, a metal layer) 19X for the lower electrode, a structural member 1Z for the resistance change element (memory element), and a structural member (for example, a metal layer) 19Z for the upper electrode are sequentially deposited on the interlayer insulating film 91 and contact plugs 81 and 85. As described above, in the case that the resistance change element is the MTJ element, the structural member 1Z includes the two magnetic layers (the reference layer and the storage layer) and the non-magnetic layer (the tunnel barrier layer) between the two magnetic layers.

Preferably the structural member 19X for the lower electrode is made of a material that can improve the characteristic of the formed resistance change element, for example, a material (for example, a material having small lattice mismatch with respect to the magnetic layer) that can improve the crystallinity of the layer included in the resistance change element. The material 19X used to form the lower electrode is properly selected according to the material used for the resistance change element.

For example, preferably the structural member 19Z for the upper electrode is made of a material that can be used as the hard mask in processing the structural member for the resistance change element. For example, preferably the structural member 19Z for the upper electrode is made of one of W, TiN, and Ta when the resistance change element is processed by ion milling.

A mask layer 99 having a predetermined shape and size is formed in the region where the memory element is formed by the photolithography and the RIE. The mask layer 99 may be a resist film (an organic film), a silicon oxide film, or a silicon nitride film.

In the embodiment, the resistance change element that is of the memory element is set to the position immediately above the contact plug 81 on the side where the contact plug 81 is not shared by the two select transistors 2 in the active region AA. Therefore, in the direction perpendicular to the surface of the semiconductor substrate 100, the mask layer 99 is provided at the position where the mask layer 99 overlaps vertically with the contact plug 81, and the mask layer 99 is located above the contact plug 81.

For example, the mask layer 99 is patterned so as to have the circular planar shape. In the direction parallel to the surface of the semiconductor substrate 100, a dimension DA of the mask layer 99 is less than the maximum dimension D2 of the contact plug 81.

The pattern of the mask layer 99 is transferred to the structural member 19Z, which is used to form the upper electrode, by the ion milling or the RIE. The structural member 19Z to which the pattern is transferred is used as the hard mask, and the structural members 1Z and 19X below the hard mask 19Z are processed by the ion milling.

Therefore, as illustrated in FIG. 11, the resistance change element (for example, the MTJ element) 1 including the lower and upper electrodes 19A and 19B is formed as the memory element on the contact plug 81 buried in the interlayer insulating film 93.

The resistance change element 1 is formed so as to have the planar shape corresponding to the planar shapes (in this case, the circular shape) of the mask layer 99 and upper electrode 19B that is of the hard mask.

For example, the resistance change element 1 is formed so as to have the tapered sectional shape according to the height (the thickness) of the resistance change element 1 including the lower and upper electrodes 19A and 19B.

For the purpose of the miniaturization of the element, in the direction parallel to the surface of the semiconductor substrate 100, the maximum dimension D1 of the resistance change element 1 is less than the maximum dimension D2 of the contact plug 81 below (immediately below) the resistance change element 1.

In the case that the resistance change element 1 including the lower and upper electrodes 19A and 19B has the tapered sectional shape, the maximum dimension D1 of the resistance change element 1 becomes the dimension of the bottom surface (the side of the semiconductor substrate 100) of the lower electrode 19A.

In the case that the contact plug 81 below the resistance change element 1 has the tapered sectional shape, the maximum dimension D2 of the contact plug 81 becomes the dimension of the upper surface (the resistance change element side) of the contact plug 81.

As illustrated in FIG. 12, after the MTJ element 1 is processed, an insulating film 30Z having a predetermined thickness is deposited on the resistance change element 1 and the interlayer insulating film 91 by the ALD. For example, the insulating film 30Z is made of SiN or $AlO_x$.

The deposited insulating film 30Z is etched back by anisotropic etching so as to be left on the side surface of the resistance change element 1.

Figure 13:
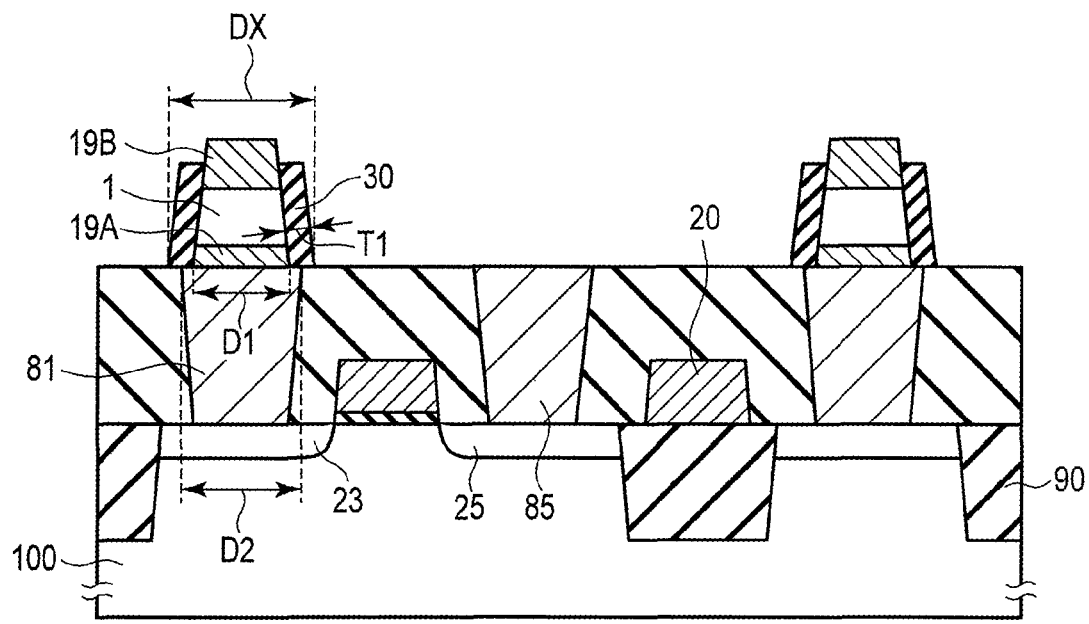
FIG. 13 is a sectional process chart illustrating a process of a method for manufacturing the resistance change type memory of the embodiment.

Therefore, as illustrated in FIG. 13, the sidewall insulating film 30 is formed on the side surface of the resistance change element 1.

The insulating film on the upper surface of the upper electrode 19B is removed by the anisotropic etching to expose the upper surface and part of side surface of the upper electrode 19B. The sidewall insulating film 30 covers the side surface of the resistance change element 1 and the lower electrode 19A. At the same time, the portion that is not covered with the lower electrode 19A in the upper surface of the contact plug 81 is covered with the sidewall insulating film 30 on the side surfaces of the resistance change element 1 and lower electrode 19A.

In the processes in FIGS. 12 and 13, the sidewall insulating film 30 having the predetermined thickness T1 is formed such that the maximum dimension DX (=D1+2×T1) of the resistance change element 1 including the sidewall insulating film 30 is greater than the maximum dimension D2 of the contact plug 81.

For example, in consideration of the variation in dimension (processing) of the contact plug 81, the variation in dimension of the MTJ element 1 immediately above the contact plug, the misalignment between the contact plug 81 and the MTJ element 1, and the dimensional difference between the contact plug and the MTJ element 1, preferably the thickness T1 of the sidewall insulating film 30 is adjusted based on the total value $(dd+(\sigma D1^2+\sigma D2^2+DS^2)^{1/2})$ of the square-root sum of the square of the variations in dimension and the misalignment and the dimensional difference dd between the resistance change element 1 and the contact plug 81.

In the embodiment, the sidewall insulating film 30 on the side surface of the resistance change element 1 can prevent the exposure of the upper surface of the contact plug 81.

Figure 14:
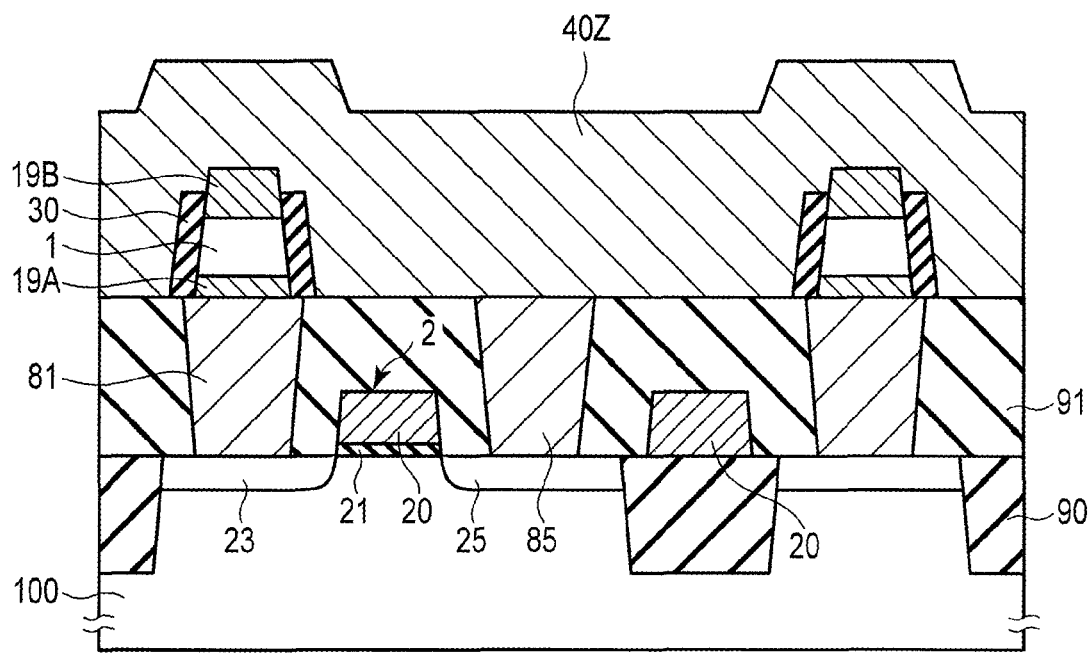
FIG. 14 is a sectional process chart illustrating a process of a method for manufacturing the resistance change type memory of the embodiment.

As illustrated in FIG. 14, after the sidewall insulating film 30 is formed on the side surface of the resistance change element 1, a conductive layer (a metal layer) 40Z is deposited on the resistance change element 1 and interlayer insulating film 91 by sputtering. The conductive layer 40Z is formed so as to cover the exposed upper surface of the upper electrode 19B. Preferably the conductive layer 40Z is made of a material that can be processed by the RIE. For example, the conductive layer 40Z is made of at least one of Ti, TiN, Ti/TiN, Al, W, and Mo.

For example, the conductive layer 40Z is formed on the interlayer insulating film 91 such that a gap between the resistance change elements 1 adjacent to each other is filled with the conductive layer 40Z. The thickness of the conductive layer 40Z is greater than the height of the resistance change element 1 including the electrodes 19A and 19B.

Figure 15:
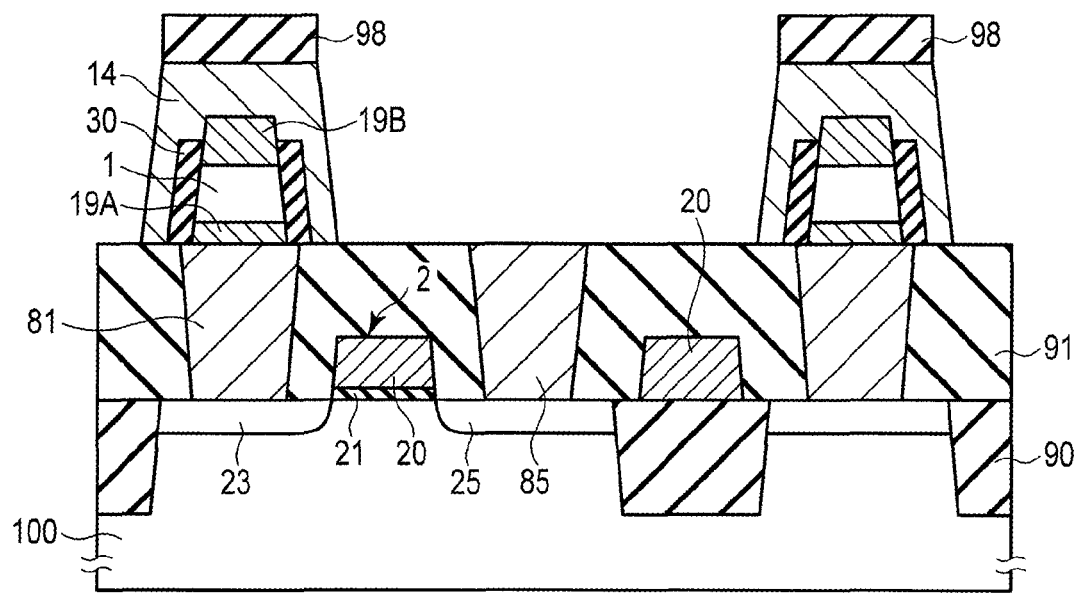
FIG. 15 is a sectional process chart illustrating a process of a method for manufacturing the resistance change type memory of the embodiment.

For example, after the planarization is performed to the upper surface of the deposited conductive layer by the CMP, a mask layer 98 having a predetermined shape is formed on the conductive layer by the photolithography and the RIE as illustrated in FIG. 15. The mask layer 98 extends in the X-direction, and is formed so as to overlap with the position where the resistance change element 1 is formed. For example, the mask layer 98 is patterned such that the dimension (a line width) of the mask layer 98 in the Y-direction is greater than or equal to the total value DX of the maximum dimension D1 of the resistance change element 1 and double the thickness of the sidewall insulating film 30 covering the side surface of the resistance change element 1.

For example, the conductive layer is processed by the RIE based on the formed mask layer 98. Therefore, the interconnect 40 that is of the bit line BL is formed on the interlayer insulating film 91. The interconnect 40 is processed so as to extend in the X-direction. The formed interconnect 40 comes into contact with the exposed portion of the upper electrode 19B, whereby the interconnect 40 is connected to the resistance change element 1.

For example, the interconnect 40 is processed so as to cover the whole exposed portion of the sidewall insulating film 30. As a result, the interconnect 40 of the resistance change memory of the embodiment covers the whole side surface of the resistance change element 1 with the sidewall insulating film 30 interposed therebetween.

As described above, the sidewall insulating film 30 having the predetermined thickness T1 is formed on the side surfaces of the resistance change element 1 and lower electrode 19A so as to cover the portion (exposed portion of the contact plug) in which the lower electrode 19A and the contact plug 81 do not overlap with each other. Because the sidewall insulating film 30 acts as a spacer, the interconnect 40 covering the side surface of the resistance change element 1 is not in contact with the contact plug 81 immediately below the resistance change element 1. The sidewall insulating film 30 electrically separates the interconnect 40 from the contact plug 81.

Figure 16:
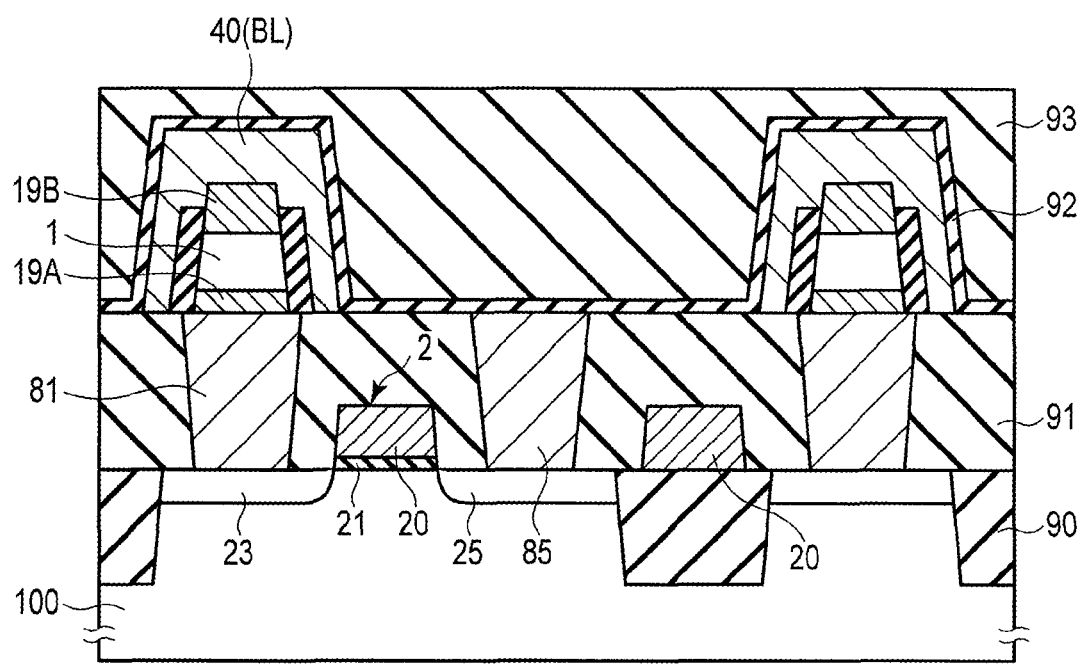
FIG. 16 is a sectional process chart illustrating a process of a method for manufacturing the resistance change type memory of the embodiment.

After the mask layer used to process the interconnect 40 is removed, the protective film 92 is deposited on the interconnect 40 by the VCD as illustrated in FIG. 16. For example, the interlayer insulating film 93 is formed on the protective film 92 by the CVD. The upper surface of the interlayer insulating film 93 is planarized by the CMP. For example, the protective film 92 is formed by a silicon nitride film and the interlayer insulating film 93 is formed by a silicon oxide film.

Hydrogen or oxygen is generated due to the formation of the interlayer insulating film 93 while the interlayer insulating film 93 made of an oxide material is deposited. In the embodiment, the resistance change element (for example, the MTJ element) 1 as the memory element is covered with not only the sidewall insulating film 30 but also the thick interconnect 40, so that the hydrogen or oxygen can be prevented from penetrating the resistance change element 1. Therefore, the degradation of the characteristic of the resistance change element 1 due to the impurity of the resistance change element 1, which is generated in forming the resistance change type memory, can be prevented. Oxidation of the interconnect 40 due to the formation of the interlayer insulating film 93 is prevented by the protective film 92.

As illustrated in FIG. 8, the contact hole is made in the deposited interlayer insulating film 93 and protective film 92 above the contact plug 85 shared by the two select transistors 2. The via plug 86 is buried in the contact hole of the interlayer insulating film 93 so as to be connected to the exposed shared contact plug 85.

For example, the conductive layer (the metal layer) is deposited on the via plug 86 and interlayer insulating film 93 by the sputtering.

The deposited conductive layer is processed so as to have a pattern extending in the X-direction. Therefore, the interconnect 41 (bBL) that forms the pair of bit lines with the interconnect 40 (BL) covering the resistance change element is formed at the interconnect level higher than that of the interconnect 40. The via plug and interconnect (the backing interconnect), which are connected to the interconnect 40 covering the resistance change element 1 may be formed at the same interconnect level as the bit line 41 through substantially the same process as the via plug 86 and interconnect 41.

In the case of the small distance between the resistance change elements 1 (the small interval between the interconnects 40), the via plug 86 can be formed in a self-aligned manner with respect to the interconnect 40 by forming the thick protective film 92.

The resistance change type memory (for example, the MRAM) of the embodiment is formed through the above processes.

In the process of manufacturing the resistance change type memory of the embodiment, after the sidewall insulating film 30 is formed on the side surface of the processed resistance change element 1, the interlayer insulating film is not formed, but the interconnect 40 is formed on the sidewall insulating film 30 so as to cover the processed resistance change element 1.

In the process of manufacturing the resistance change type memory of the embodiment, the main manufacturing process, which is performed from when the resistance change element 1 is formed to when the interconnect 40 is formed, includes the process of forming the sidewall insulating film 30 and the process of removing the sidewall insulating film 30 on the upper electrode 19B of the resistance change element 1. Therefore, the number of manufacturing processes that are performed until the resistance change element 1 and the interconnect 40 are electrically connected can be decreased in the process of manufacturing the resistance change type memory of the embodiment.

As a result, the decrease in process margin caused by manufacturing process that are performed until the resistance change element 1 and the interconnect 40 are electrically connected, for example, the processing variation of the element and the fluctuation in thickness in the manufacturing processes, can be suppressed.

In the process of manufacturing the resistance change type memory of the embodiment, the interconnect 40 is formed so as to cover the resistance change element 1 that is of the memory element, which allows the interconnect 40 to suppress the diffusion of the impurity generated in the resistance change type memory manufacturing process into the resistance change element 1.

The interconnect 40 made of the metal having the relatively high thermal conductivity is formed so as to cover the resistance change element 1, which allows the radiation of the heat (for example, Joule heat) generated in the resistance change element 1 during the operation of the resistance change element 1. Therefore, according to the manufacturing method of the embodiment, the resistance change type memory that improves the thermal stability can be provided.

In the case that the system LSI including the resistance change type memory of the embodiment is formed, the processes of manufacturing the resistance change type memory and the logic circuit, which are formed in the same chip, can be commonalized to improve the compatibility between the resistance change type memory and the logic circuit.

As described above, according to the method for manufacturing the resistance change type memory of the embodiment, the high-reliability resistance change type memory can be provided through the relatively simple process.

(3) Modifications

Modifications of the resistance change memory of the embodiment will be described with reference to FIGS. 17 to 28. In the modifications, substantially the same structural element as the resistance change memory of the embodiment is designated by the same numeral, and the description thereof is made as needed.

(a) Interconnect Structure

Modifications of the structure of the interconnect covering the memory element included in the resistance change type memory will be described with reference to FIGS. 17 to 21.

EXAMPLE 1

A modification of the interconnect structure of the resistance change type memory will be described with reference to FIGS. 17 and 18.

FIG. 17 is a plan view illustrating a modification of the memory element and interconnect, which are included in the resistance change type memory of the embodiment. FIG. 18 is a sectional view illustrating the sectional structure of the memory element and interconnect in the direction intersecting the interconnect extending direction (the first direction) of FIG. 17.

As illustrated in FIGS. 17 and 18, the interconnect 40 extends in the first direction (an interconnect length direction).

In the second direction (an interconnect width direction) intersecting the first direction with respect to the direction parallel to the surface of the semiconductor substrate, a dimension (interconnect width) D4 of an interconnect (the bit line) 40A covering the resistance change element 1 may be less than the total value DX of the maximum dimension D1 of the MTJ element 1 in the direction parallel to the surface of the semiconductor substrate and double the thickness T1 of the sidewall insulating film 30.

In this case, the side surface of the resistance change element 1 in the interconnect extending direction is covered with the interconnect 40A with the sidewall insulating film 30 interposed therebetween.

On the other hand, the side surface of the resistance change element 1 in the direction intersecting the extending direction of the interconnect 40A is not covered with the interconnect 40A, but the side surface of the resistance change element 1 is covered with a protective film/interlayer insulating film 92 and 93 with the sidewall insulating film 30 interposed therebetween.

The sidewall insulating film 30 is in contact with the interconnect 40A in the extending direction of the interconnect 40A, and the sidewall insulating film 30 is in contact with the interlayer insulating film in the direction intersecting the extending direction of the interconnect 40A.

In the resistance change type memory including the interconnect 40A in FIGS. 17 and 18, the short circuit between the interconnects 40A adjacent to each other in the second direction can be decreased by reducing the dimension in the second direction of the interconnect 40A covering the resistance change element 1.

In the resistance change type memory including the interconnect 40A in FIGS. 17 and 18, the interval between the interconnects 40A adjacent to each other in the second direction and the interval between the memory elements 1 adjacent to each other in the second direction can be decreased, because the interval (the margin) between the interconnects, for the purpose of the prevention of the short circuit, can be decreased. As a result, the size of the memory cell can be reduced.

EXAMPLE 2

Another modification of the interconnect structure of the resistance change type memory, which differs from that in FIGS. 17 and 18, will be described with reference to FIG. 19.

FIG. 19 illustrates a sectional structure of a memory cell array in the extending direction of the interconnect (for example, the bit line) 40 covering the resistance change element 1, and FIG. 19 corresponds to a line V-V of FIG. 4.

As illustrated in FIG. 19, when an interconnect 40B has a structure that the interconnect 40B covers the side surface of the resistance change element 1 with the sidewall insulating film 30 interposed therebetween, a thickness (a dimension in the direction perpendicular to the surface of the semiconductor substrate) H4 of the interconnect 40B on the interlayer insulating film 91 may be less than the height H1 of the resistance change element 1 including the lower and upper electrodes 19A and 19B.

For the structure in FIG. 19, a deposition amount of the conductive layer used to form the interconnect 40B can be decreased compared with the case that the conductive layer having the thickness greater than the height of the resistance change element 1 including the lower and upper electrodes 19A and 19B is deposited like the process in FIG. 14. The process of planarizing the upper surface of the interconnect 40B by the CMP can be eliminated.

As a result, the production cost of the resistance change type memory can be reduced in the resistance change type memory including the interconnect 40B in FIG. 19.

EXAMPLE 3

Still another modification of the interconnect structure of the resistance change type memory, which differs from that in FIGS. 17 to 19, will be described with reference to FIGS. 20 and 21.

FIG. 20 illustrates a sectional structure of a memory cell array in the direction oblique to the extending directions of the bit line and word line, and FIG. 20 corresponds to a line VIII-VIII of FIG. 4.

As illustrated in FIG. 20, the sidewall insulating film 30 may be provided between the bottom surface of the interconnect 40 and the interlayer insulating film 91. Therefore, the short circuit between the interconnect 40 and the contact plug 81 can further be prevented.

A method for manufacturing the structure in FIG. 20 will be described with reference to FIG. 21.

As illustrated in FIG. 21, after a sidewall insulating film 30X is deposited on the resistance change element 1 and interlayer insulating film 91 through the process in FIG. 12, an insulating film (for example, a resist film) 97 is formed on the sidewall insulating film 30X by an application method (spin coating) such that good flatness is obtained.

For example, the thickness of the insulating film 97 is adjusted by the etching during and after the formation of the insulating film 97 such that the upper surface of the insulating film 97 is located below the upper surface of the upper electrode 19B of the resistance change element 1 with respect to the semiconductor substrate 100. Therefore, the sidewall insulating film 30 covering the upper electrode 19B of the resistance change element 1 is exposed. Preferably the position of the upper surface of the insulating film 97 in the direction perpendicular to the surface of the semiconductor substrate 100 is set to the upper side (the opposite side of the semiconductor substrate side) from the boundary portion between the upper electrode 19B and the resistance change element 1.

The sidewall insulating film 30 is etched while the upper surface of the insulating film 97 is located on the semiconductor substrate 100 side than the upper surface of the upper electrode 19B of the resistance change element 1.

Therefore, the upper surface and part of side surface of the upper electrode 19B are exposed. On the other hand, the sidewall insulating film 30X covered with the insulating film 97 remains on the resistance change element 1, the lower electrode 19A, and the interlayer insulating film 91.

After the insulating film on the sidewall insulating film 30X is removed, the conductive layer used to form the interconnect is formed on the sidewall insulating film 30X through substantially the same process as that in FIG. 14. In Example 3, the upper surface of the interlayer insulating film 91 is covered with the sidewall insulating film 30X.

Then, through substantially the same process as that in FIG. 15, the conductive layer is deposited and processed into a predetermined shape. As illustrated in FIG. 20, the interconnect 40 is formed so as to cover the side surface of the resistance change element 1 with the sidewall insulating film 30 interposed therebetween. The sidewall insulating film 30 remains between the bottom surface of the interconnect 40 and the interlayer insulating film 91. Therefore, the sidewall insulating film 30 is provided between the bottom surface of the interconnect 40 and the interlayer insulating film 91.

Preferably the sidewall insulating film 30 remaining except between the interconnect 40 and the interlayer insulating film 91 is removed before the protective film 92 and interlayer insulating film 93, which cover the interconnect, are formed on the interlayer insulating film 91. In this case, a residue caused by the conductive layer used to form the interconnect 40 is removed from the upper surface of the interlayer insulating film 91 together with the sidewall insulating film on the shared contact plug 85. Therefore, the short circuit between the interconnect 40 and the plugs 85 and 86 due to the conductive residue is suppressed.

As illustrated in FIGS. 20 and 21, in the resistance change type memory including the sidewall insulating film 30 between the interconnect 40 and the interlayer insulating film 91, the short circuit between the interconnect 40 and the contact plugs 81, 85, and 86 can be suppressed, and the high-reliability resistance change type memory can be provided.

EXAMPLE 4

Yet another modification of the interconnect structure of the resistance change type memory, which differs from that in FIGS. 17 to 21, will be described with reference to FIG. 22.

As illustrated in FIG. 22, with no use of the interconnect, an upper electrode 19C may cover the side surface of the resistance change element 1 with the sidewall insulating film 30 interposed therebetween For example, the upper electrode 19C is formed so as to extend in a certain direction (for example, the bit line extending direction), and the upper electrode 19C is commonly connected to the plural resistance change elements (the resistance change portion) 1 arrayed in the extending direction of the upper electrode 19C. Therefore, the upper electrode 19C can be used as the interconnect 40.

In the case that the resistance change element including the upper electrode 19C in FIG. 22 is formed, for example, the mask layer is formed using the insulation or the resist film in order to process the resistance change element 1 and the lower electrode 19A.

The mask layer made of the insulator is removed after the resistance change element 1 is processed into a predetermined shape. In the case that the sidewall insulating film 30 is formed after the mask layer is removed, the upper electrode 19C that is of the interconnect 40 covers the side surface on the upper side of the resistance change element (the resistance change portion) 1 as illustrated in FIG. 22. The upper edge of the sidewall insulating film 30 is located below the boundary between the resistance change element (the resistance change portion) 1 and the upper electrode 19C (on the semiconductor substrate side).

The sidewall insulating film 30 may be formed before the mask layer is removed. In the case that the sidewall insulating film 30 is formed before the mask layer is removed, the upper edge of the sidewall insulating film 30 is located above the boundary between the resistance change element 1 and the upper electrode 19C (on the opposite side of the semiconductor substrate side). The upper electrode 19C is formed on the upper surface of the resistance change element 1, from which the mask layer is peeled off, through an opening at the upper edge of the sidewall insulating film 30. Even in the case that the sidewall insulating film 30 is formed before the mask layer is removed, the sidewall insulating film 30 may be etched back until the side surface on the upper portion side of the resistance change element 1 is exposed.

In the resistance change type memory in FIG. 22, the height of the resistance change element 1 can be decreased, and the size of the resistance change type memory in the direction parallel to the surface of the semiconductor substrate can be reduced.

(b) Memory Cell Array

Modifications of the memory cell array of the resistance change memory of the embodiment will be described with reference to FIGS. 23 to 26.

FIG. 23 is a plan view illustrating a modification of the layout of the memory cell array of the resistance change type memory. FIG. 24 illustrates a sectional structure taken on a line XXIV-XXIV of FIG. 23.

As illustrated in FIG. 23, the bit lines BL and bBL extend in the X-direction and the word line WL extends in the Y-direction. For example, the two interconnects 40 and 41 forming the pair of bit lines BL and bBL are provided at the interconnect levels M1 and M2 different from each other.

In the modification in FIG. 23, the active region AA has a linear planar shape, and extends in the direction (the direction oblique to the X-Y plane) intersecting the X-direction and Y-direction in the direction parallel to the surface of the semiconductor substrate 100. The shallow trench isolation region extending in the direction oblique to the X-Y plane is provided between the active regions AA.

At least two memory cells are provided in the active region AA. The memory cell in FIGS. 23 and 24 has a circuit configuration different from that of the memory cell in FIG. 3. Each memory cell includes the resistance change element 1 that is of the memory element and the two select transistors 2. The memory cell MC is connected to three bit lines different from one another.

In the common active region AA, the resistance change elements 1 and the shared contact plug 85 are alternately laid out in the extending direction of the active region AA.

As illustrated in FIGS. 23 and 24, the resistance change element 1 is provided below the interconnect 40 so as to overlap with the interconnect 40 in the direction perpendicular to the surface of the semiconductor substrate 100. The resistance change elements 1 are laid out in the memory cell array so as to be arrayed in the X-direction and Y-direction. The resistance change elements 1 arrayed in the X-direction are provided in the active regions AA different from one another. Similarly, the resistance change elements 1 arrayed in the Y-direction are provided in the active regions AA different from one another.

The shared contact plug 85 is provided below the interconnect 41 so as to overlap with the interconnect 41 in the direction perpendicular to the surface of the semiconductor substrate 100. The shared contact plugs 85 are laid out in the memory cell array so as to be arrayed in the X-direction and Y-direction. The shared contact plugs 81 arrayed in the X-direction are provided in the active regions AA different from one another. Similarly, the shared contact plugs 81 arrayed in the Y-direction are provided in the active regions AA different from one another.

The active region AA and the word line WL intersect each other between the resistance change element 1 and the shared contact plug 85. The select transistor 2 is provided at the position where the active region AA and the word line WL intersect each other.

The memory cells MC adjacent to each other in the common active region AA are electrically separated by turning off the select transistor 2.

In the memory cell array 100 having the layout in FIG. 23, as illustrated in FIG. 24, the resistance change element 1 is provided in the interconnect 40 with the sidewall insulating film 30 interposed therebetween like the resistance change element and interconnect in FIGS. 2 and 9.

In the case that the layout of the memory cell array in FIGS. 23 and 24 is used, the memory cell MC has a dimension 4F in the X-direction and a dimension 2F in the Y-direction. In the memory cell array in FIG. 23, each memory cell has a cell size of $8F^2$.

Figure 25:
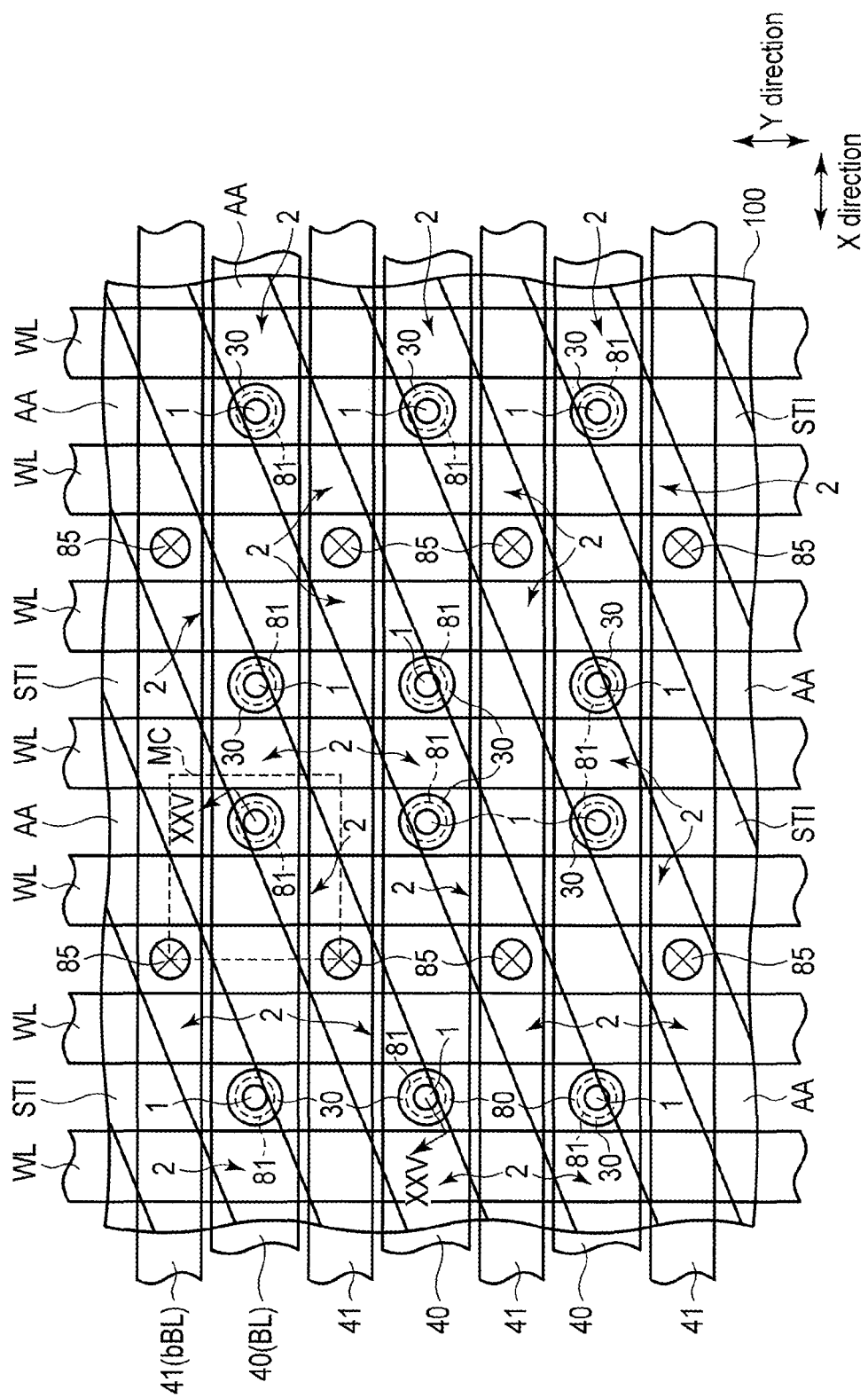
FIG. 25 is a view illustrating modifications of the resistance change type memory of the embodiment.

FIG. 25 is a plan view illustrating another modification of the layout of the memory cell array different from that in FIG. 23. FIG. 26 illustrates a sectional structure taken on a line XXVI-XXVI of FIG. 25.

In another modification in FIG. 25, like the modification in FIGS. 23 and 24, the active region AA and the shallow trench isolation region STI extend in the direction oblique to the X-Y plane.

The memory cell array in FIG. 25 differs from the memory cell array in FIG. 23 in the layout of the resistance change element 1 and shared contact plug 85, which are provided in the active region AA extending in the oblique direction.

In the memory cell array in FIG. 25, at least the two memory cells are provided in the active region AA. Each memory cell MC substantially includes the resistance change element 1 that is of the memory element and the select transistor 2.

The plural resistance change elements 1 are laid out at the positions at each of which the resistance change element 1 overlaps with the interconnect 40 in the direction perpendicular to the surface of the semiconductor substrate 100. The plural shared contact plugs 85 are laid out at the positions at each of which the shared contact plug 85 overlaps with the interconnect 40 in the direction perpendicular to the surface of the semiconductor substrate 100.

The two resistance change elements 1 adjacent to each other along the X-direction in the active region AA are laid out such that the word line WL is sandwiched between the resistance change elements 1 in the X-direction. In the word line laid out between the two resistance change elements 1 adjacent to each other in the X-direction, the select transistor 2 connected to the word line is a transistor that electrically separates the memory cells from each other, and the select transistor 2 is shared by the memory cells adjacent to each other.

The two resistance change elements 1, which are provided in the active regions AA different from each other and are adjacent to each other in the X-direction, are laid out such that the two word lines WL are sandwiched between the two resistance change elements 1 in the X-direction.

The two resistance change elements 1, which are adjacent to each other in the oblique direction in the active region AA, are laid out such that the two word line WL and the shared contact plug 85 between the two word lines WL is sandwiched between the two resistance change element being adjacent to each other in the oblique direction.

For example, a line connecting centers of the two resistance change elements 1, which are adjacent to each other in the oblique direction with the shared contact plug 85 interposed therebetween in the active region AA, is deviated from a center line of the active region AA along the extending direction of the active region AA.

The shared contact plugs 85 arrayed in the X-direction and Y-direction are provided in the active regions AA different from one another. The three word lines WL are laid out between the two shared contact plugs 85 arrayed in the X-direction.

For example, the center of the resistance change element 1 and the center of the contact plug 81 immediately below the resistance change element 1 are set at the positions deviated from the center line of the active region AA along the extending direction of the active region AA. For example, the resistance change elements 1 arrayed in the X-direction, the centers of the resistance change elements 1, and the centers of the contact plugs 81 immediately below the resistance change elements 1 are set at the positions overlapping with the center line of the interconnect 40 along the X-direction.

The interconnect width of the interconnect 40, which covers the side surface of the resistance change element 1 via the sidewall insulating film 30, may differ from the interconnect width of the interconnect 41 connected to the shared contact plug 85.

As illustrated in FIG. 26, the interconnect 40, which covers the side surface of the resistance change element 1 with the sidewall insulating film 30 interposed therebetween, may be provided at the interconnect level above the interconnect 41 connected to the shared contact plug 85.

The resistance change element 1 is connected to one end of the current path of the select transistor 2 through the two stacked contact plugs 81A and 81B. The interconnect 41 is connected to the other end of the current path of the select transistor 2 through the two stacked contact plugs 85 and 86.

The contact plug 81B that is in direct contact with the resistance change element 1 is provided in the contact hole that is made so as to penetrate the two interlayer insulating films 94 and 95.

For example, in the case that the layout of the memory cell array 100 in FIGS. 25 and 26 is used, the memory cell MC has the dimension 3F in the X-direction and the dimension 2F in the Y-direction. Therefore, in the memory cell array 100 in FIGS. 25 and 26, each memory cell MC has a cell size of about $6F^2(3F \times 2F)$.

Even in the layout of the memory cell array 100 including the active region AA extending in the direction oblique to the X-Y plane as illustrated in FIGS. 23 to 26, the resistance change type memory of the modification has the structure in which the resistance change element 1 is provided in the interconnect 40 with the sidewall insulating film 30 interposed therebetween as illustrated in FIGS. 2 and 9.

As described above, the use of the layout of the memory cell array in FIGS. 23 to 26 can reduce the cell size of the memory cell and improve the storage density of the resistance change type memory.

(c) Memory Element

Modifications of the memory element of the resistance change memory of the embodiment will be described with reference to FIGS. 27 and 28.

In the above embodiment, the MRAM is described as an example of the resistance change type memory. Alternatively, the resistance change type memory may be a resistance change type memory other than an MRAM, such as an ReRAM (Resistive RAM), a PCRAM (Phase Change RAM) and an ion memory.

Figure 27:
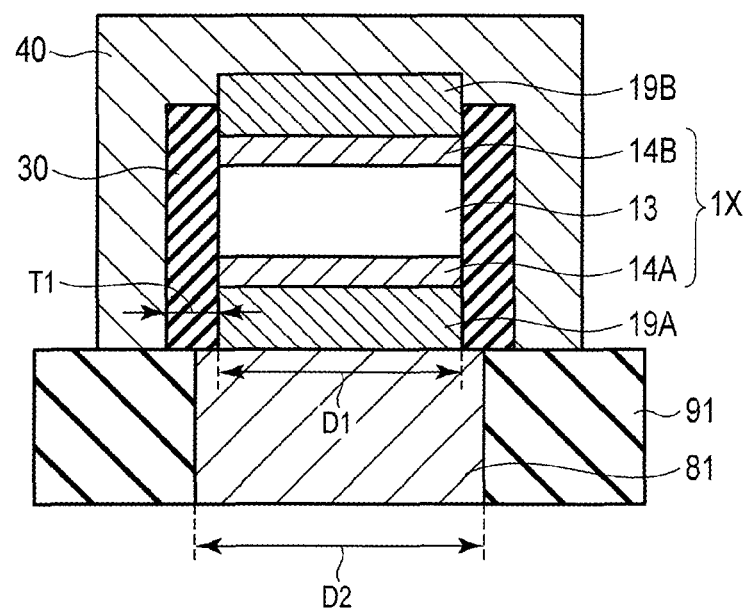
FIG. 27 is a view illustrating modifications of the resistance change type memory of the embodiment.

FIG. 27 illustrates a structural example of the memory element (the resistance change element) 1 used for the ReRAM.

In the memory element used for the ReRAM, a conductivity or an insulating property of a film (hereinafter referred to as a resistance change film) included in the memory element changes by the voltage, the current, or the heat. In the memory element used for the ReRAM, the resistance value of the element changes reversibly according to the change in characteristic of the resistance change film, and the state in which the resistance value changes is retained in a nonvolatile manner.

As illustrated in FIG. 27, the resistance change element 1 as a memory element 1X includes two metal layers 14A and 14B and a resistance change film 13 sandwiched between the metal layers 14A and 14B.

For example, the resistance change film 13 is made of metal oxides, such as perovskite metal oxide or binary metal oxide. For example, a resistance state of the resistance change film 13 changes due to generation or elimination of a fine current path (filament) in the resistance change film 13 and movement of a constituent element (or an ion) of a resistance change film 13 (a change in concentration profile).

The resistance state of the resistance change element 1X can be changed between the low resistance state and the high resistance state by controlling pulse shapes of an applied voltage (supply current), such as a pulse amplitude, a pulse width, and a pulse polarity with respect to the resistance change element (metal oxide element) 1X that is of the memory element of the ReRAM. In the data read, a read voltage having the pulse shape different from that of the voltage (a set voltage/a reset voltage) at which the resistance state changes is applied to the resistance change element 1X to detect the current (or a fluctuation in potential at the interconnect) passed through the resistance change element 1X, thereby determining the resistance state of the resistance change element 1X.

In the structure in FIG. 27, the two metal films 14A and 14B between which the resistance change film 13 is sandwiched are provided as a member in order to express the resistance change of the resistance change film 13. Alternatively, the lower electrode 19A and the upper electrode 19B may be made of the same materials as the metal films 14A and 14B. In this case, the metal films 14A and 14B are not provided, but the resistance change film 13 is in direct contact with the lower and upper electrodes 19A and 19B.

In the case that a characteristic that the resistance state of the resistance change element 1X changes is expressed only by the resistance change film 13 irrespective of the metal films 14A and 14B, the resistance change film 13 may be in direct contact with the lower and upper electrodes 19A and 19B without providing the metal films 14A and 14B.

Figure 28:
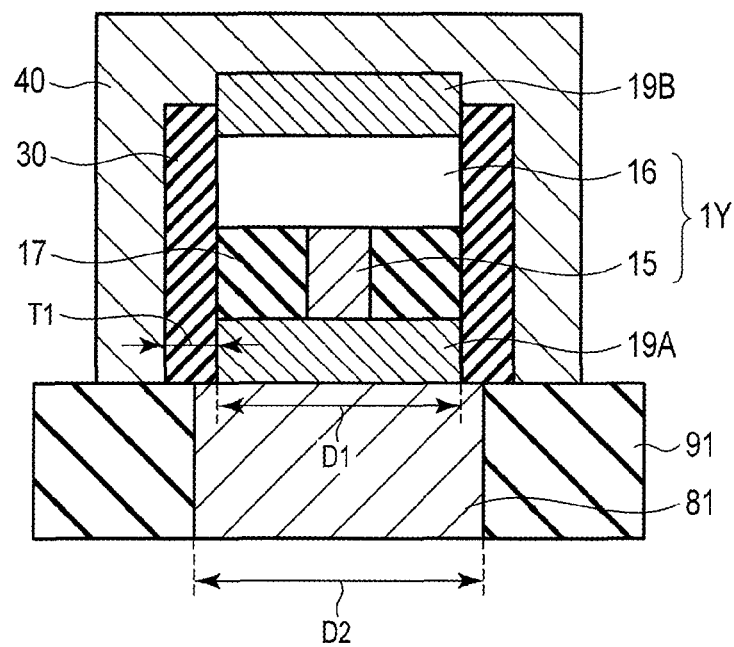
FIG. 28 is a view illustrating modifications of the resistance change type memory of the embodiment.

FIG. 28 illustrates a structural example of the memory element used for the PCRAM.

In the PCRAM, a phase change element is used as the memory element. In a phase change element 1Y, a crystalline phase of the film changes reversibly from a crystalline state to an amorphous state or from the amorphous state to the crystalline state by externally-provided energy. The resistance value (impedance) of the phase change element changes as a result of the state change of the crystalline phase. The state in which the crystalline phase of the phase change element changes is retained in the nonvolatile manner until the energy necessary for the change of the crystalline phase is provided.

In the phase change element 1Y in FIG. 28, a heater layer 15 and a phase change film (the resistance change film) 16 are provided between the lower electrode 19A and the upper electrode 19B. The upper electrode 19B is provided on the phase change film 16.

The phase change film 16 is made of a phase change material. The phase change film 16 is changed to the crystalline state or the amorphous state by the heat generated in writing the data. For example, the phase change film 16 is made of chalcogenide.

The heater layer 15 is in contact with the bottom surface of the phase change film 16. Desirably an area in which the heater layer 15 is in contact with the phase change film 16 is less than an area of the bottom surface of the phase change film 16. This is because a heating portion of the phase change film 16 is decreased by decreasing a contact portion between the heater layer 15 and the phase change film 16 to reduce the write current or voltage. For example, an insulating layer 17 that is of a spacer is provided between the phase change film 16 and the lower electrode 19A, and the heater layer 15 is buried in a through-hole of the insulating layer 17.

The heater layer 15 is made of a conductive material. For example, the heater layer 15 is made of one of TiN, WN, MoN, an aluminum alloy, and a copper alloy. The heater layer 15 may be made of the same material as the lower electrode 19A. In the phase change element 1Y, preferably high-melting-point metals, such as Ta, Mo, and W, are used as the lower electrode 19A and the upper electrode 19B.

A heating temperature and a heating time of the phase change film 16 can be changed by controlling magnitude and a width of a current pulse applied to the phase change element 1Y. As a result, the phase change film 16 changes to the crystalline state or the amorphous state.

A writing operation is performed to the phase change element 1Y as the memory element by changing the crystalline state of the phase change film 16. During the writing operation, the voltage or the current is applied between the lower and upper electrodes 19A and 19B. The heat is generated in the heater layer 15 by the current passed through the lower and upper electrodes 19A and 19B. The phase change film 16 changes to the crystalline state or the amorphous state according to a quantity of heat generated in the heater layer 15 and a time for which the heat is applied.

As regards whether the phase change film 16 is in the crystalline state or the amorphous state is determined, namely, as regards how the resistance state of the phase change film 16 is determined, the low voltage or current is applied between the lower and upper electrodes 19A and 19B to an extent by which neither crystallization nor the amorphous state of the phase change film 16 is generated, and the current passed through the phase change element 1Y is read to determine the resistance state of the phase change film 16.

As described above with reference to FIGS. 27 and 28, the resistance states of the elements 1X and 1Y different from the magneto-resistance effect element and the data to be stored can be correlated with each other.

As illustrated in FIGS. 27 and 28, the memory elements (the resistance change elements) 1X and 1Y of the ReRAM and PCRAM are provided immediately above the contact plug 81. The interconnect 40 connected to the upper electrode 19B covers the side surfaces of the memory elements 1X and 1Y via the sidewall insulating film 30.

In the direction parallel to the surface of the semiconductor substrate, the maximum dimensions D1 of the memory elements 1X and 1Y are less than the maximum dimension D2 of the contact plug 81. The total value of each of the maximum dimensions D1 of the memory elements 1X and 1Y and double of the thickness T1 of the sidewall insulating film 30 is greater than the dimension D2 of the contact plug 81.

Therefore, the above effect can be obtained even if the memory element used for the ReRAM or PCRAM is used in the resistance change type memory of the embodiment.

As described above with reference to FIGS. 17 to 28, in the modifications of the resistance change type memory of the embodiment, the effect of the example described with reference to FIGS. 1 to 16 is obtained, and the effect corresponding to the configuration of each modification is obtained.

(4) Application Example

An application example of the resistance change type memory of the embodiment will be described with reference to FIG. 29.

As illustrated in FIG. 29, the resistance change type memory of the embodiment can be applied to a system LSI 900.

A logic circuit 201 is formed on the same substrate as the semiconductor substrate (chip) 100 on which a resistance change type memory 200 of the embodiment is formed. For example, a circuit region 209 where volatile memories, such as a DRAM, and an analog circuit are formed may be provided in the same semiconductor substrate 100 as the resistance change type memory 200 and logic circuit 201.

The interlayer insulating film and interconnect of the logic circuit 201 are designed so as to fall within specifications (tolerances) in consideration of an interconnect capacitance and the like.

As illustrated in FIGS. 2 and 9, the resistance change type memory 200 of the embodiment has the structure in which the resistance change element 1 is provided in the interconnect 40 with the sidewall insulating film 30 interposed therebetween, so that the thickness of the interlayer insulating film 91 covering the resistance change element 1 and interconnect 40 can be adjusted according to the specification of the logic circuit 201.

As a result, the resistance change type memory 200 and the logic circuit 201 can be formed in the same chip 100 through substantially the same processes.

As described above, in the embodiment, the compatibility of the structure and manufacturing method between the resistance change type memory 200 and the logic circuit 201, which are provided in the same chip, can be improved.

Accordingly, in the system LSI in which the resistance change type memory of the embodiment is used, the production cost can be reduced and the reliability of the semiconductor device can be improved.

[Others]

The resistance change type memory in which the memory cell includes the memory element and the select transistor is described in the above embodiment. Alternatively, the resistance change type memory of the embodiment may be used for a cross-point type memory cell array.

In the cross-point type memory cell array, a memory cell unit constructed by the memory element and the selection element (for example, a diode or a vertical transistor) is sandwiched between the interconnects extending in the directions intersecting each other.

The interconnect 40 that covers the memory element 1 with the sidewall insulating film interposed therebetween may be the bit line and may be the word line according to the configuration of the resistance change type memory including the cross-point type memory cell array.

The contact plug connected to the lower electrode of the memory element of the embodiment can be replaced with the conductive layer connecting the memory element and the selection element or the conductive layer connecting the memory element and the interconnect. The contact plug connected to the lower electrode of the memory element may be replaced with the interconnect or selection element, which is provided on the lower layer side of the memory element. The interconnect may cover the surface of the selection element with the sidewall insulating film interposed therebetween.

Even if the resistance change type memory includes the cross-point type memory cell array, the above effect can be obtained as long as the resistance change element that is of the memory element, the contact plug (or the conductor immediately below the resistance change element), and the interconnect have the structure of the embodiment. That is, the high-reliability cross-point type resistance change type memory can be provided at the relatively low production cost.

The dimension D1 of the resistance change element 1 may be equal to the dimension D2 of the contact plug 81 to the direction parallel to the surface of the semiconductor substrate.

The examples described above can properly be combined with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change type memory comprising:
a resistance change element provided on a first interlayer insulating film on a substrate, wherein the resistance change element includes a lower electrode and an upper electrode, and wherein at least two resistance states of the resistance change element and data to be stored are correlated with each other;
a sidewall insulating film provided on a side surface of the resistance change element;
a first plug which is provided in the first interlayer insulating film, and which is connected to the lower electrode of the resistance change element; and
a first interconnect which is provided on and contacts the first interlayer insulating film, and which is connected to the upper electrode of the resistance change element,
wherein the resistance change element is provided immediately above the first plug,
wherein the first interconnect covers the side surface of the resistance change element via the sidewall insulating film, and a portion of the first interconnect runs parallel to and faces the side surface of the resistance change element and the sidewall insulating film, and
wherein an upper surface of the first plug is covered with the lower electrode and the sidewall insulating film.

2. The resistance change type memory according to claim 1, wherein a first dimension of the first plug in a direction parallel to a substrate surface is greater than a second dimension of the resistance change element in the direction parallel to the substrate surface.

3. The resistance change type memory according to claim 2, wherein a total value of the second dimension of the resistance change element in the direction parallel to the substrate surface and a doubled thickness of the sidewall insulating film is greater than the first dimension of the first plug in the direction parallel to the substrate surface.

4. The resistance change type memory according to claim 1, wherein the sidewall insulating film is provided between a bottom surface of the first interconnect and the first interlayer insulating film.

5. The resistance change type memory according to claim 1, wherein the first interconnect extends in a first direction, and
wherein the first interconnect covers the whole side surface of the resistance change element via the sidewall insulating film.

6. The resistance change type memory according to claim 2, wherein the first interconnect extends in a first direction,
wherein a third dimension of the first interconnect in the first direction is greater than a total value of the second dimension of the resistance change element in the direction parallel to the substrate surface and a doubled thickness of the sidewall insulating film, and
wherein a fourth dimension of the first interconnect in a second direction orthogonal to the first direction and in the direction parallel to the substrate surface is less than or equal to a total value of the second dimension of the resistance change element in the direction parallel to the substrate surface and a doubled thickness of the sidewall insulating film.

7. The resistance change type memory according to claim 6, wherein the sidewall insulating film on the side surface of the resistance change element in the first direction is in contact with the first interconnect, and wherein the sidewall insulating film on the side surface of the resistance change element in the second direction is in contact with a second interlayer insulating film covering the first interconnect.

8. The resistance change type memory according to claim 1, wherein an upper surface of the sidewall insulating film is located closer to the substrate than an upper surface of the upper electrode.

9. The resistance change type memory according to claim 8, wherein a side surface of the upper electrode is in contact with the first interconnect.

10. The resistance change type memory according to claim 6, wherein a fifth dimension of the first interconnect in a direction perpendicular to a substrate surface is greater than a sixth dimension of the resistance change element in the direction perpendicular to the substrate surface.

11. The resistance change type memory according to claim 10, wherein a seventh dimension of the first interconnect in a direction perpendicular to a substrate surface is less than or equal to a eighth dimension of the resistance change element in the direction perpendicular to the substrate surface.

12. The resistance change type memory according to claim 1, further comprising a select transistor provided on an active region of the substrate, the select transistor including one end of a current path connected to the resistance change element through the first plug, the other end of the current path connected to a second interconnect through a second plug in the first interlayer insulating film, and a gate electrode connected to a third interconnect.

13. The resistance change type memory according to claim 12, wherein the first and second interconnects extend in a first direction,
 wherein the third interconnect extends in a second direction orthogonal to the first direction in a direction parallel to a substrate surface, and
 wherein the active region extends in a third direction oblique to the first and second directions in the direction parallel to the substrate surface.

* * * * *